(12) United States Patent
Noma et al.

(10) Patent No.: US 10,634,968 B2
(45) Date of Patent: *Apr. 28, 2020

(54) ACTIVE MATRIX SUBSTRATE AND DISPLAY PANEL

(71) Applicant: SHARP KABUSHIKI KAISHA, Sakai, Osaka (JP)

(72) Inventors: Takeshi Noma, Sakai (JP); Kohhei Tanaka, Sakai (JP); Takayuki Nishiyama, Sakai (JP); Ryo Yonebayashi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/224,454

(22) Filed: Dec. 18, 2018

(65) Prior Publication Data
US 2019/0121213 A1 Apr. 25, 2019

Related U.S. Application Data

(63) Continuation of application No. 15/528,498, filed as application No. PCT/JP2015/082588 on Nov. 19, 2015, now Pat. No. 10,191,344.

(30) Foreign Application Priority Data

Nov. 21, 2014 (JP) .................................. 2014-236843

(51) Int. Cl.
G09G 3/36 (2006.01)
G02F 1/1362 (2006.01)
(Continued)

(52) U.S. Cl.
CPC ...... *G02F 1/136286* (2013.01); *G02F 1/1368* (2013.01); *G02F 1/13454* (2013.01);
(Continued)

(58) Field of Classification Search
CPC ......... G02F 1/136286; G02F 2201/123; G02F 1/13454; G02F 2201/56; G02F 1/1368;
(Continued)

(56) References Cited

U.S. PATENT DOCUMENTS 9,524,675 B2 * 12/2016 Wei ...................... G09G 3/3233
9,685,131 B2 * 6/2017 Tanaka ................. G09G 3/3648
(Continued)

FOREIGN PATENT DOCUMENTS

JP H11-184406 A 7/1999
JP 2004-227751 A 8/2004
(Continued)

OTHER PUBLICATIONS

Notice of Allowance and Fee(s) Due dated Sep. 19, 2018 for U.S. Appl. No. 15/528,498.

*Primary Examiner* — Rodney Amadiz
(74) *Attorney, Agent, or Firm* — ScienBiziP, P.C.

(57) ABSTRACT

Provided is an active matrix substrate that includes gate lines (13G), source lines, pixel switching elements, a plurality of gate line driving circuits (11) that control potentials of the gate lines, in the display region, and control signal lines (15L1) that supply a control signal to the gate line driving circuits (11). Each of the gate line driving circuits (11) includes driving switching elements and a capacitor. At least part of the driving switching elements and the capacitor are arranged at positions closer to, not the gate line (13G) corresponding to the gate line driving circuit (11), but another gate line (13G).

8 Claims, 19 Drawing Sheets

(51) Int. Cl.
  *G09F 9/00* (2006.01)
  *G09F 9/30* (2006.01)
  *G02F 1/1345* (2006.01)
  *G02F 1/1368* (2006.01)
  *G11C 19/28* (2006.01)

(52) U.S. Cl.
  CPC .................. *G09F 9/00* (2013.01); *G09F 9/30* (2013.01); *G09G 3/3648* (2013.01); *G09G 3/3677* (2013.01); *G09G 3/3688* (2013.01); *G02F 2201/123* (2013.01); *G02F 2201/56* (2013.01); *G09G 2300/0426* (2013.01); *G09G 2300/0804* (2013.01); *G09G 2310/0286* (2013.01); *G09G 2310/08* (2013.01); *G11C 19/28* (2013.01)

(58) Field of Classification Search
  CPC .. G09G 3/3648; G09G 3/3677; G09G 3/3688; G09G 2310/0286; G09G 2300/0804; G09G 2310/08; G09G 2300/0426; G09F 9/30; G09F 9/00; G11C 19/28
  See application file for complete search history.

(56) References Cited

U.S. PATENT DOCUMENTS

| | | | |
|---|---|---|---|
| 10,191,344 B2 * | 1/2019 | Noma | G02F 1/1368 |
| 2004/0150610 A1 | 8/2004 | Zebedee et al. | |
| 2012/0019497 A1 * | 1/2012 | Kim | G09G 3/3677 345/210 |
| 2015/0293546 A1 | 10/2015 | Tanaka et al. | |
| 2016/0019856 A1 * | 1/2016 | Tanaka | G09G 3/3648 345/206 |
| 2016/0247442 A1 * | 8/2016 | Dai | G09G 3/3677 |

FOREIGN PATENT DOCUMENTS

| | | |
|---|---|---|
| WO | 2014069529 A1 | 5/2014 |
| WO | 2014142183 A1 | 9/2014 |

* cited by examiner

US 10,634,968 B2

ACTIVE MATRIX SUBSTRATE AND DISPLAY PANEL

TECHNICAL FIELD

The present invention relates to an active matrix substrate and a display panel.

BACKGROUND ART

In recent years, a technique of arranging gate drivers in a pixel region on an active matrix substrate of a display panel has been proposed (see, for example, WO 2014/069529 (Patent Document 1 shown below)). WO2014/069529 discloses driving circuit that controls potentials of lines including gate lines according to control signals supplied from outside of a display region including a pixel region. This driving circuit includes a plurality of switching elements, and at least part of these switching elements are formed in the pixel region. This enables to reduce the rounding of the potentials applied to lines such as the gate lines on the active matrix substrate, and drive the lines at a high speed. Besides, at narrower frame can be achieved.

PRIOR ART DOCUMENT

Patent Document

Patent Document 1: WO2014/069529

SUMMARY OF THE INVENTION

Problem to be Solved by the Invention

According to the above-described conventional configuration, some pixels in which the switching elements of the driving circuit are provided, and other pixels in which the switching elements thereof are not provided, exist together in the pixel region. At the pixels in which the switching elements of the driving circuit are provided, in some cases, the potentials of the switching elements of the driving circuit could possibly change simultaneously at a timing when the switching elements for pixel driving are turned ON/OFF. In this case, there is a risk that signals input to the pixels are influenced by potential changes of the switching elements of the driving circuit. This results in that the pixels influenced by the switching elements of the driving circuit have a luminance different from the other pixels. This causes display irregularities to occur. In other words, the display quality deteriorates.

The present application discloses a configuration that is capable of suppressing the deterioration of display quality, in a configuration in which switching elements of a gate line driving circuit are arranged in a pixel region on an active matrix substrate.

Means to Solve the Problem

An active matrix substrate in one embodiment of the present invention includes a plurality of gate lines that extend in a first direction in a display region; a plurality of source lines that extend in a second direction in the display region, the second direction being different from the first direction; and pixel switching elements provided for pixels, respectively, in the display region and are connected to the gate lines and the source lines, the pixels being defined by the gate lines and the source lines. Further, the active matrix substrate includes: a plurality of gate line driving circuits that are provided in the display region, in correspondence to each the gate lines to control a potential thereof; and a control signal line that supplies a control signal from outside the display region to the gate line driving circuits. Each of the gate line driving circuits includes a plurality of driving switching elements for switching ON/OFF according to the control signal, and a capacitor that is connected to at least one of the driving switching elements. At least part of the driving switching elements and the capacitor are arranged at positions closer to, not the gate line corresponding to the gate line driving circuit that includes the driving switching elements, but another gate line that is other than the corresponding gate line.

Effect of the Invention

According to the disclosure of the present application, with the configuration in which the switching elements of the gate line driving circuit are arranged in the pixel region on the active matrix substrate, the deterioration of display quality can be suppressed.

BRIEF DESCRIPTION OF DRAWINGS

FIG. 2 is a top view illustrating a schematic configuration of an active matrix substrate 20a.

FIG. 3 is a top view illustrating a schematic configuration of the active matrix substrate 20a, and respective parts connected with the active matrix substrate 20a.

MODE FOR CARRYING OUT THE INVENTION

Figure 1:
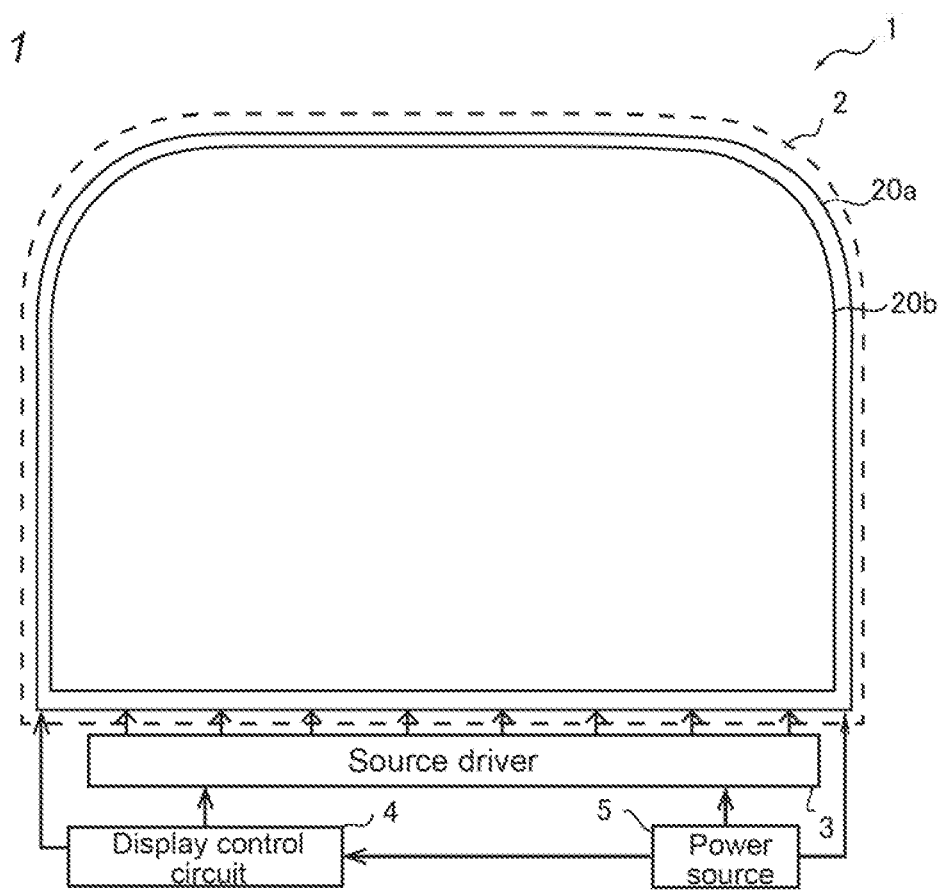
FIG. 1 is a top view illustrating a schematic configuration of a liquid crystal display device according to the present embodiment.

An active matrix substrate in one embodiment of the present invention includes a plurality of gate lines that extend in a first direction in a display region; a plurality of source lines that extend in a second direction in the display region, the second direction being different from the first direction; and pixel switching elements provided for pixels, respectively, in the display region and are connected to the gate lines and the source lines, the pixels being defined by the gate lines and the source lines. Further, the active matrix substrate includes: a plurality of gate line driving circuits that are provided in the display region, in correspondence to the gate lines, respectively, the gate line driving circuit controlling the potentials of the gate lines, respectively; and as control signal line that supplies a control signal from outside the display region to the gate line driving circuits. Each of the gate line driving circuits includes a plurality of driving switching elements for switching ON/OFF according to the control signal, and a capacitor that is connected to at least one of the driving switching elements. At least part of the driving switching elements and the capacitor are arranged at positions closer to, not the gate line corresponding to the gate line driving circuit that includes the driving switching elements, but another gate line that is other than the corresponding gate line.

In the above-described configuration, the ON/OFF of the driving switching elements in the gate line driving circuit is switched according to the control signal, whereby the potential of the gate line corresponding to the gate line driving circuit (the gate line as a control target) is controlled. According to the change of the potential of the gate line, the pixel switching elements connected to the gate line operate. The timings of the turning ON/OFF of the pixel switching elements, therefore, highly possibly coincides with the change of potentials of the driving switching elements of the gate line driving circuit that controls the gate line to which the pixel switching elements are connected or the capacitor connected to the driving switching elements. According to the above-described configuration, at least part of the driving switching elements and the capacitor of the gate line driving circuit are arranged at positions closer to, not the gate line corresponding to the gate line driving circuit, but another gate line. Therefore, at least part of the driving switching elements and the capacitor of the gate line driving circuit are arranged at positions closer to, not the pixel switching elements connected to the gate line as a control target, but the pixel switching elements connected to another gate line. In other words, the driving switching elements are arranged at positions closer to, not the pixel switching element whose ON/OFF is switched high possibly at the same timing, but the pixel switching element whose ON/OFF is switched less possibly at the same timing. This causes the signal input to the pixels to be less influenced by the driving switching elements of the gate line driving circuit. As a result, the luminance of the pixels is less changed due to the gate line driving circuit, and display irregularities hardly occur. Further, the deterioration of display quality is suppressed.

The configuration can be such that the another gate line is arranged between the at least part of the driving switching elements and the capacitor, and the gate line corresponding to the gate line driving circuit that includes the driving switching elements. This makes it possible to prevent a change of the potential of the driving switching elements from exerting influences on the pixels of the gate line as a control target.

Each of the gate line driving circuits may include an accumulation line for accumulating a voltage to be applied to the gate line corresponding to the gate line driving circuit. In this case, the capacitor can include a first capacitor connected to between the accumulation line and the corresponding gate line. The driving switching elements can include a first switching element connected to between the accumulation line and the corresponding gate line. At least any of the accumulation line, the first capacitor, and the first switching element can be arranged at a position closer to the another gate line, than the corresponding connected gate line.

According to this configuration, the capacitor or the accumulation line can be arranged at a position closer to, not the pixel switching element whose potential channel highly possibly at the same timing, but the pixel switching element whose potential changes less possibly at the same timing. This causes the signal input to the pixels to be less influenced by potential changes in the driving switching elements of the gate line driving circuit.

The driving switching elements of the gate line driving circuit can be arranged in an array of the pixels that are aligned along the another gate line other than the gate line corresponding to the gate line driving circuit. In this case, between the array of the pixels along the another gate line, and an array of the pixels along the gate line corresponding to the gate line driving circuit, at least still another one array of the pixels can be arranged. This allows at least one another pixel to be arranged between the driving switching elements of the gate line driving circuit and the gate line as a control target. According to this configuration, the driving switching elements of the gate line driving circuit can be arranged in the vicinity of, not the pixel switching element whose potential changes highly possibly at the same timing, but the pixel switching element whose potential changes less possibly at the same timing.

The control signal can include a clock signal, and the clock signal can be a multiphase clock of four or more phases. With this configuration, the timing of at potential change of the driving switching elements of the gate line driving circuit, and the timing of a potential change of the pixel switching elements of another gate line arranged at a position closer as compared with the gate line that is a control target of the foregoing gate driving circuit, can be prevented from coinciding with each other.

The control signal line can include a clock signal line, and the clock signal line can include: a first clock line that extends in the first direction in the display region, and is connected to at least one of the switching elements of the gate line driving circuit in the display region; and a second clock line that is connected to the first clock line and extends in the second direction outside the display region. With this configuration, the clock signal line can be arranged so that the clock signal line, and the gate line to which the pixel switching elements whose ON/OFF is switched at the same timing as the clock signal are connected, should not intersect with each other in the display region. Therefore, influences of the clock signal on the signals to be input to the pixels can be suppressed. As a result, the deterioration of image quality can be further suppressed A display panel including the above-described active matrix substrate, a counter substrate opposed to the active matrix substrate, and a liquid crystal layer provided between the active matrix substrate and the counter substrate is also one of embodiments of the present invention.

The following describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of part of constituent members is omitted. Further, the dimension ratios of the constituent members illustrated in the drawings do not necessarily indicate the real dimension ratios.

Embodiment 1

(Configuration of Liquid Crystal Display Device)

FIG. 1 is a top view illustrating a schematic configuration of a liquid crystal display device according to the present embodiment. The liquid crystal display device 1 includes a display panel 2, a source driver 3, a display control circuit 4, and a power source 5. The display panel 2 includes an active matrix substrate 20a, a counter substrate 20b, and a liquid crystal layer (not illustrated) interposed between these substrates. Though illustration omitted in FIG. 1, polarizing plates are provided on a lower surface of the active matrix substrate 20a, and on a top surface of the counter substrate 20b. On the counter substrate 20b, there are formed a black matrix, color filters of three colors of red (R), green (G), and blue (B), and a common electrode (all of these are not illustrated).

As illustrated in FIG. 1, in the display panel 2, upper end parts on left and right sides on the drawing sheet are formed in circular arc shapes. In other words, the outer shape of the display panel 2 as viewed in a direction vertical to the substrates is a non-rectangular shape. The active matrix substrate 20a of the display panel 2 is electrically connected with the source driver 3. The display control circuit 4 is electrically connected with the display panel 2, the source driver 3, and the power source 5. The display control circuit 4 outputs control signals to the source driver 3, and gate drivers formed on the active matrix substrate 20a (exemplary gate line driving circuits), which are to be described below. The control signals include a reset signal (CLR), clock signals (CKA, CKB), data signals and the like used for displaying images on the display panel 2. The power source 5 is electrically connected with the display panel 2, the source driver 3, and the display control circuit 4, and supplies a power source voltage signal to each of the same.

(Configuration of Active Matrix Substrate)

Figure 2:
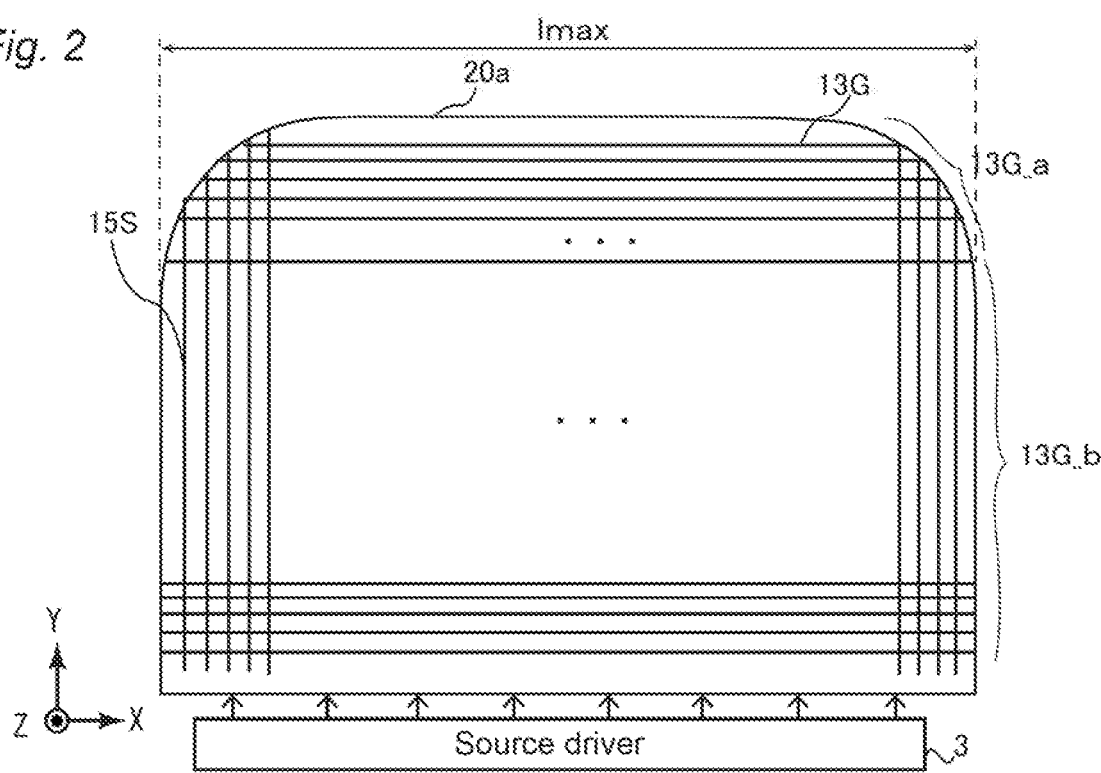

FIG. 2 is a top view illustrating a schematic configuration of the active matrix substrate 20a. As illustrated in FIG. 2, the upper ends on left and right sides of the active matrix substrate 20a are formed in circular arc shapes. In other words, the outer shape of the active matrix substrate 20a as viewed in a direction vertical to the substrate surface is a non-rectangular shape. In the active matrix substrate 20a, gate lines 13G are formed at uniform intervals in approximately parallel to one another from an end to the other end in the X axis direction. Among the gate lines 13G, the gate lines 13G_a formed in the circular arc shape part are shorter than the maximum length of the gate lines in the active matrix substrate 20a. Further, the maximum length of the gate lines can be set to be approximately equal to the maximum Imax of the width of the active matrix substrate 20a in the X-axis direction. For example, the gate lines 13G_b, which are the gate lines other than the gate lines 13G_a, can be set to be shorter than the maximum Imax, or approximately equal to the maximum Imax.

Further, as illustrated in FIG. 2, source lines 15S are formed to intersect with the gate lines 13G. The gate lines 13G are formed to extend in the row direction (horizontal direction), which is an exemplary first direction, and the source lines 15S are formed to extend in the column direction (vertical direction), which is an exemplary second direction. With this configuration, the gate lines 13G and the source lines 15S are arranged in a matrix form. An area surrounded by the gate lines 13G and the source lines 15S forms one pixel, and all of the areas of the pixels constitute a display region of the display panel 2. In other words, a region in which an image is displayed by the pixels is the display region. In each pixel, a pixel electrode connected to the gate line 13G and the source line 15S is provided.

Figure 3:
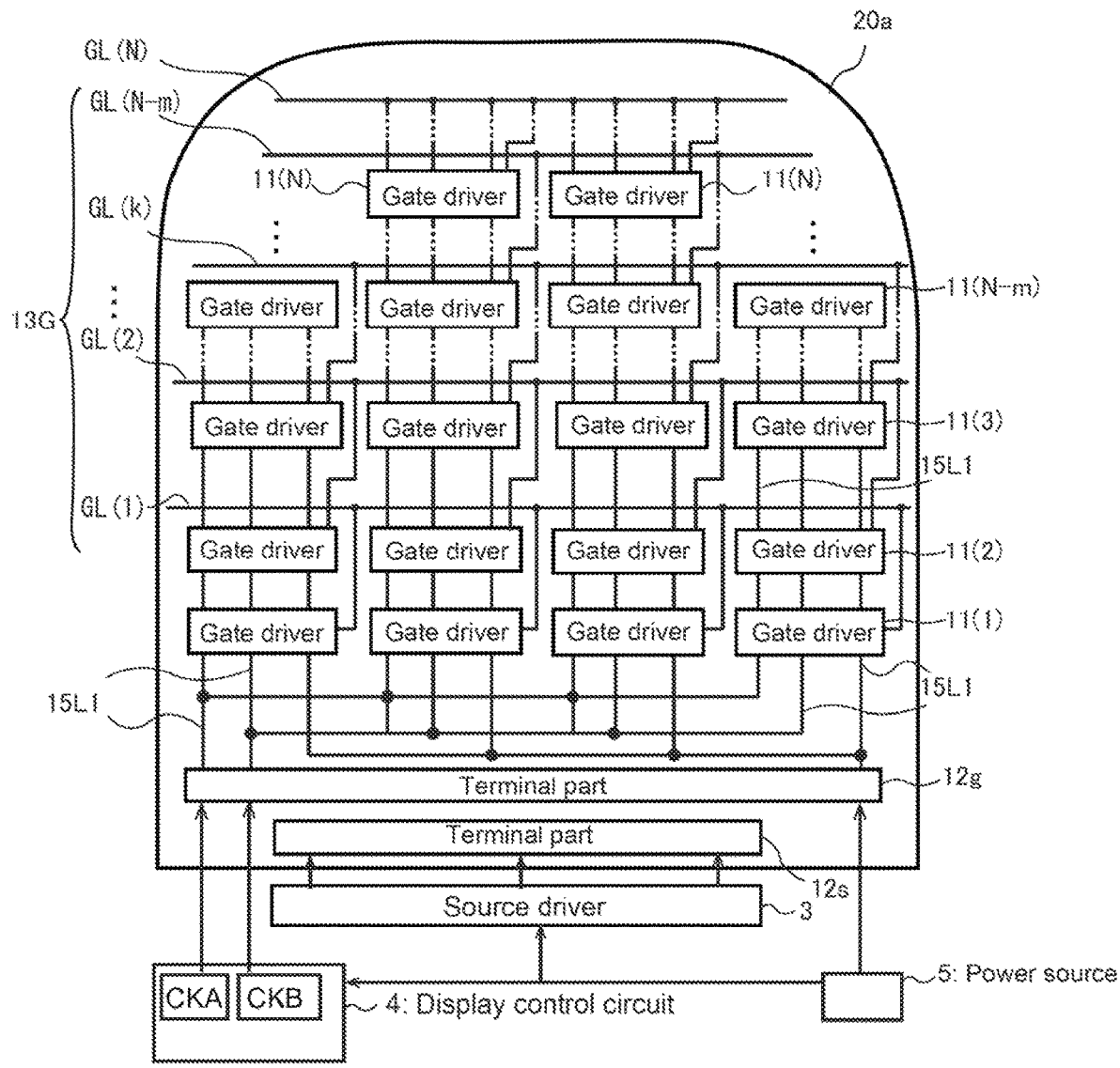

FIG. 3 is a top view illustrating a schematic configuration of the active matrix substrate 20a (the illustration of the source lines 15S is omitted), and respective parts connected with the active matrix substrate 20a. As illustrated in the example of FIG. 3, in spaces between the gate lines 13G, that is, in the display region, gate drivers 11(1) to 11(N) are formed (hereinafter, these are collectively referred to as "gate drivers 11" when they are not distinguished particularly). The gate driver 11 is an exemplary gate line driving circuit that controls the voltage level (potential) of the gate line 13G according to control signals supplied from outside the display region. The gate drivers 11(1) to 11(N) are provided so as to correspond to the gate lines GL(1) to GL(N), respectively.

In the following description, circuits provided for controlling the voltage level of one gate line 13G are assumed to be one gate driver 11 (in other words, one gate line driving circuit). Each gate driver 11 controls a voltage level of one gate line corresponding to the gate driver 11. In other words, each gate driver 11 is provided so as to correspond to the gate line 13G as a target of the control. Each gate driver 11 outputs a voltage signal to the gate line 13G corresponding to the same. The configuration, therefore, is such that a plurality of the gate drivers 11 are connected to a plurality of the gate lines 13G, respectively. The gate drivers 11 may be connected to, not only the gate lines 13G as the control targets, but also the gate lines other than the gate lines as the control targets (detailed examples are described below).

In the example illustrated in FIG. 3, the gate drivers 11 in the display region are arranged at positions closer to gate lines other than the gate lines 13G corresponding thereto, that is, the control lines as the control targets. For example, the gate driver 11(2) corresponding to the gate line GL(2) is arranged at a position closer to the gate line GL(1), than to the gate line GL(2). In other words, the gate driver 11(k) (not illustrated in FIG. 3) corresponding to the gate line GL(k) in the k'th row is arranged at a position closer to the gate line GL(k−1) (not shown) adjacent to the gate line GL(k), than to the gate line GL(k).

Incidentally, for the gate driver 11(1) corresponding to the gate line GL(1), positioned at an end, the gate line GL(1) as a gate line to winch the gate driver 11(1) corresponds is the gate line arranged at the closest position to the gate driver 11(1). In other words, the gate drivers 11(1) to 11(N) other than the gate driver 11(1) or 11(N) corresponding to one of the gate lines GL(1), GL(N) at both ends of a plurality of the gate lines 13G are arranged at positions closer to other gate lines than to the gate lines corresponding to the same, respectively. In this case, the gate driver 11(1) corresponding to the gate line GL(1) at the end may be arranged outside the display region.

Further, in the example illustrated in FIG. 3, four gate drivers 11 are connected to each of the gate lines 13G denoted by GL(1), GL(2), . . . GL(K), and two gate drivers 11 are connected to each of the gate lines 13G denoted by GL(K), GL(N−m) to GL(N).

In the display region of the active matrix substrate 20a, in a frame region on a side where the source driver 3 is provided, a terminal part 12g is formed. The terminal part 12g is connected with the control circuit 4 and the power source 5. The terminal part 12g receives control signals output from the control circuit 4 and the power source 5. The control signals include, for example, clock signals (CKA, CKB), a reset signal, or a power source voltage signal. The control signals such as the clock signals (CKA, CKB) and the power source voltage signal, input to the terminal part 12g, are supplied to each gate driver 11 through the lines 15L1. The gate drivers 11, in accordance with the control signals supplied thereto, output selection signals indicating a selection state or a non-selection state, to the gate lines 13G connected thereto.

Further, the gate drivers 11 connected to the gate lines 13G on each stage are connected to the gate lines 13G on the previous stage. This allows the gate drivers 11 on each stage to receive a selection signal from the gate lines 13G on the previous stage as a set signal. In other words, the gate drivers 11 of each stage can output a selection signal to the gate line connected thereto, and can output a set signal to the gate line 13G on the next stage. In the following description, an operation of outputting a selection signal to one gate line 13G is called "driving of the gate line 13G" in some cases.

Further, in the active matrix substrate 20a, in the frame region on the side where the source driver 3 is provided, a terminal pan 12s that connects the source driver 3 and each source line 15S with each other is formed. The source driver 3 outputs a data signal to each source line 15S (see FIG. 2), according to the control signals input from the display control circuit 4.

As illustrated in FIG. 3, in the present embodiment, a plurality of the gate drivers 11 are connected to each of the gate lines 13G denoted by GL(1) to GL(N) in the display region. The gate drivers 11 connected to the identical gate line 13G are in synchronization, and one gate line 13G is simultaneously driven by these gate drivers 11. In the present embodiment, a plurality of the gate drivers 11 corresponding to one gate line 13G are connected to the one gate line 13G at approximately equal intervals in the direction in which the gate line 13G extends, in such a manner that loads on the gate drivers 11 for driving the one gate line 13G should be approximately equal.

(Configuration of Gate Driver 11)

Figure 4:
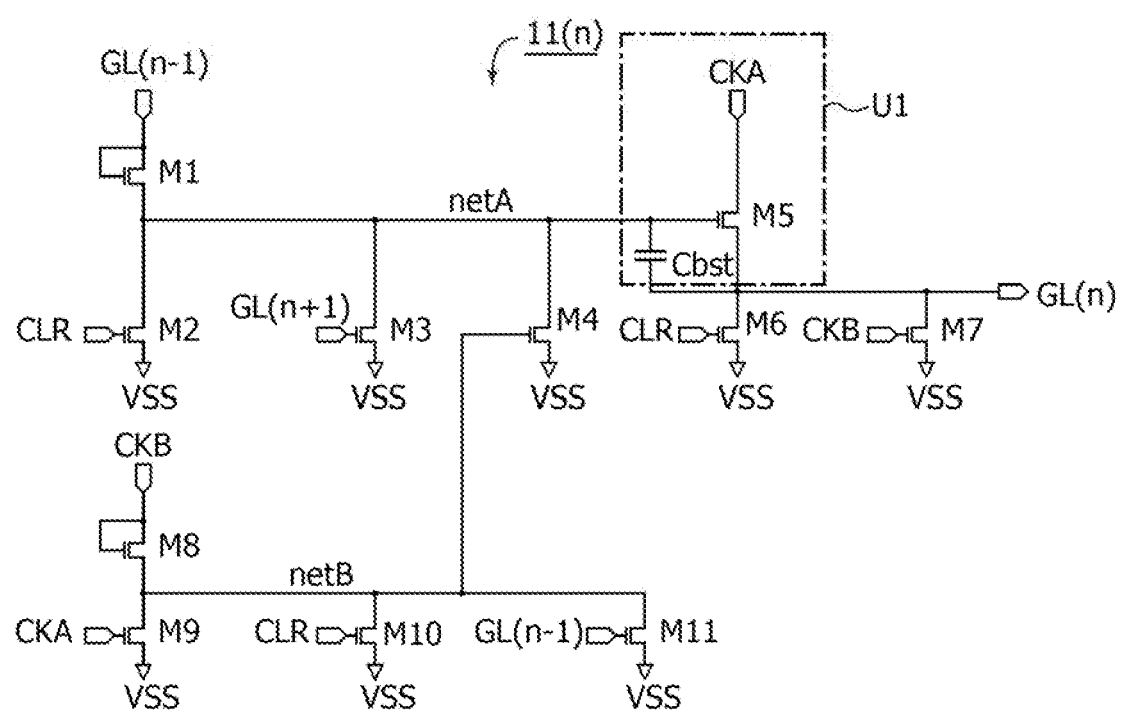
FIG. 4 illustrates an exemplary equivalent circuit of a gate driver 11.

Here, the configuration of the gate driver 11 according to the present embodiment is described. FIG. 4 illustrates an exemplary equivalent circuit of the gate driver 11 that drives the gate line 13G of GLn (n is a natural number of 1, 2, . . . , N−1, N). As illustrated in FIG. 4, the gate driver 11 includes TFTs M1 to M11 formed with thin film transistors (TFTs) as switching elements, a capacitor Cbst, and lines netA, netB. Here, netA is one example of an accumulation line for accumulating the voltage to be applied to the gate line 13G. The gate driver 11 includes an output unit U1 as a circuit block.

The output unit U1 controls the conduction between netA as an exemplary accumulation line and the gate line GL(n). The output unit U1 includes TFT M5 (one example of a first switching element) connected to between netA and the gate line GL(n). Further, in the present example, the output unit U1 includes the capacitor Cbst (one example of a first capacitor) connected to between the gate line GL(n) and netA. With the capacitor Cbst and TFT M5, a voltage to be applied to the gate line GL(n) can be accumulated in netA. The output unit U1, therefore, can be regarded as the last buffer for charging a voltage signal to be applied to the gate line GL(n). Further, the output unit U1 can be regarded as an output circuit that includes a switching element and a capacitor connected to between the gate line GL(n) and netA. In the example illustrated in FIG. 4, the gate of TFT M5 is connected to netA, the drain thereof is connected to a control signal line that supplies the clock signal CKA, and the source thereof is connected to the gate line GL(n). Further, one electrode of the capacitor Cbst is connected to the GL(n) and a source of TFT M5, and the other electrode thereof is connected to netA. With this configuration, a bootstrap circuit can be formed.

To netA, TFT M1 is connected. TFT M1 is an element of a circuits that composes an accumulated voltage supply unit that causes the voltage of netA as an accumulation line to vary according to a signal input from another gate line. TFT M1 is connected to between netA and the gate line GL(n−1) of the previous stage, and causes the voltage of netA to vary according to a signal input from the gate line GL(n−1) of the previous stage. In the present example, the gate and the drain of TFT M1 are connected with the gate line GL(n−1) of the previous stage (diode connection), and the source of TFT M1 is connected to netA. With this configuration, at a timing when a selection signal of the gate line GL(n−1) of the previous stage is received, a voltage to be applied to the gate line GL(n) can be charged to netA. In this way, TFT M1 can be regarded as a charging circuit that accumulates, to netA, a voltage for applying a voltage at a level of a selected state (high level in the present example) to the gate line GL(n).

To netA, further, TFTs M2 to M4 are connected. To the gate of TFT M4, netB is connected. To netB, TFTs M8 to M11 are connected. A circuit composed of these TFTs M2 to M4, and M8 to M11 can be regarded as an accumulated voltage adjustment unit that adjusts the voltage of netA to a predetermined level according to the control signals. TFTs M2 to M4, and M8 to M11 adjust the voltage of the accumulation line netA to a predetermined level according to the control signals or a signal of another gate line GL(n+1).

In the example illustrated in FIG. 4, TFTs M2 to M4 and M8 to M11 compose a circuit that controls the voltage of netA in order to return the voltage of the gate line GL(n) from the level of the selected state to the level of the non-selected state at an appropriate timing. For this purpose, TFT M4 is connected to between netA and a control signal line that supplies a power source voltage signal VSS at a predetermined level (low level). TFTs 8 to M11 generate a signal for controlling the turning ON/OFF of TFT M4, based on the clock signals CKA, CKB and a set signal from the gate line GL(n−1) of the previous stage. TFT M2 is connected to between netA and the control signal line that supplies the power source voltage signal VSS, and supplies the power source voltage signal VSS to netA according to the reset signal CLR. TFT M3 is connected to between netA and the control signal line that supplies the power source voltage signal VSS, and supplies the power source voltage signal VSS to netA according to a signal of the gate line GL(n+1) of the next stage.

More specifically, the source of TFT M8 is connected to netB, and the gate and the drain thereof are connected to the control signal line that supplies the clock signal CKB (diode connection). Regarding TFT M9, the drain thereof is connected to netB, the gate thereof is connected to the control signal line that supplies the clock signal CKA, and the source thereof is connected to the control signal line that supplies the power source voltage signal VSS. The drain of TFT M10 is connected to netB, the gate thereof is connected to the control signal line that supplies the reset signal CLR, and the source thereof is connected to the control signal line that supplies the power source voltage signal VSS. The drain of TET M11 is connected to netB, the gate thereof is connected to GL(n−1) of the previous stage, the source thereof is connected to the control signal line of the power source voltage signal VSS.

TFTs M6 and M7 connected to the gate line GL(n) are elements of a circuit that adjusts the voltage of the gate line GL(n) to a predetermined level according to control signals. In the present example, TFTs M6 and M7 adjust the voltage of the gate line GL(n) to a level for the non-selection state based on the control signals. For this purpose, TFTs M6 and M7 are provided between the gate line GL(n) and the control signal line for the power source voltage signal VSS at the predetermined level (low level).

The drain of the TFT M6 is connected to the gate line GL(n), the gate thereof is connected to the control signal line for the reset signal CLR, the source thereof is connected to the control signal line for the power source voltage signal VSS. The drain of the TFT M7 is connected to the gate line GL(n), the gate thereof is connected to the control signal line for the clock signal CKB, and the source thereof is connected to the control signal line for the power source voltage signal VSS.

In the present embodiment, the phase of the clock signal CKA and the phase of the clock signal CKB are opposite to each other. The phase of the clock signal for the gate driver 11 of the gate line of each stage, and the phase of the clock signal for the gate driver 11 of the gate line of the adjacent stage are opposite to each other, too. Therefore, for example, the gate driver 11 of the gate line GL(n+1) has such a configuration that CKA and CKB are replaced with each other in the configuration illustrated in FIG. 4. More specifically, in the gate driver of the gate line GL(n), the clock signals supplied to TFT M7, TFT M5, TFT M9, and TFT M8 are arranged so as to have phases opposite to those of the clock signals supplied to TFTs of the gate driver of the adjacent gate line GL(n+1), respectively.

The reset signal CLR, for example, can be kept at a H level for a predetermined certain period before the start of scanning of the gate lines. In this case, the reset signal CLR rises to the H level every vertical period. The rise of the reset signal CLR to the H level causes netA and the gate line GL to be reset to the L level (the level of the power source voltage signal VSS). Further, at the start of one vertical period, to the gate line GL(1) on the first stage, a gate start pulse (GSP) is input as a signal S.

(Exemplary Arrangement in Display Region)

Figure 5:
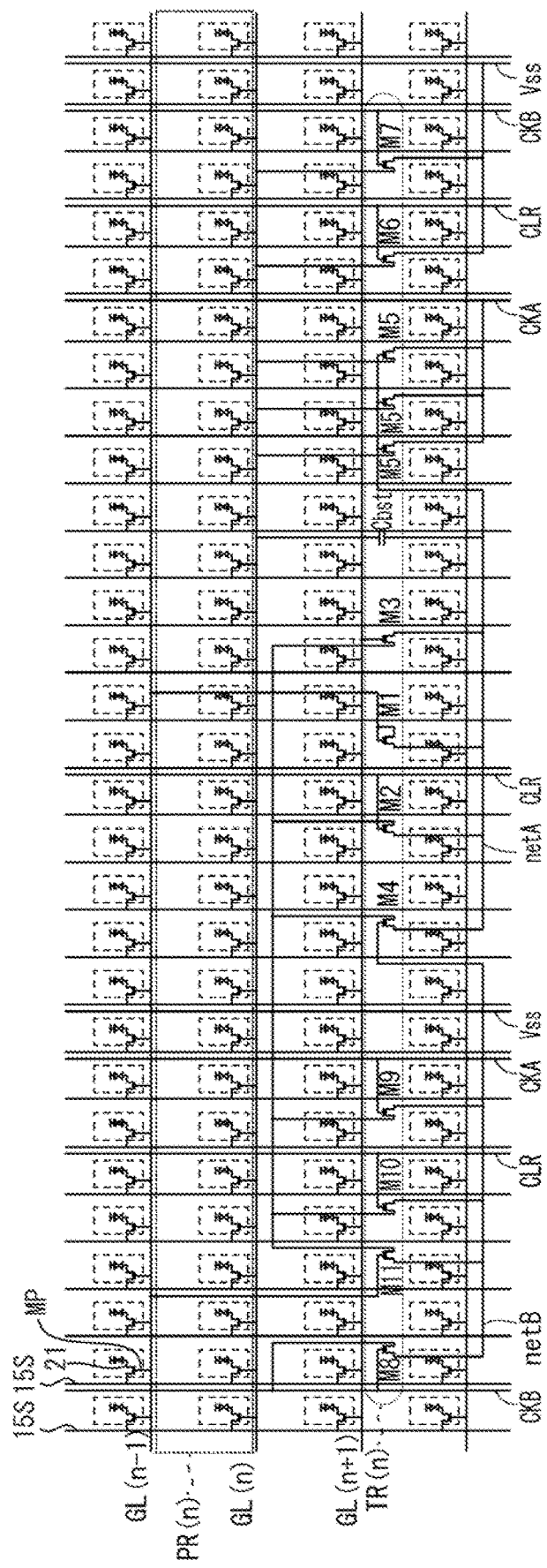
FIG. 5 illustrates an exemplary circuit configuration in a case where the gate driver 11 illustrated in FIG. 4 is arranged in a display region.

FIG. 5 illustrates an exemplary circuit configuration in a case where the gate driver 11 illustrated in FIG. 4 is arranged in the display region. In the display region, pixels are arranged at positions corresponding to points of intersection between the source lines 15S and the gate lines GL, respectively. In each pixel, TFT MP, which is an exemplary pixel switching element, is provided. TFT MP is connected to the source lines 15S and the gate lines GL. Further, TFT MP is connected to a pixel electrode 21. TFT MP is turned ON (the conductive state) at a timing when the gate line GL is selected. When TFT MP is in an ON state, a data signal from the source line 15S is supplied to the pixel electrode 21.

The pixels are arranged in a row direction along each gate line GL. For example, pixels PR(n) in the n'th row, are arranged along the gate line GL(n) in the n'th row. TFTs MP of the pixels of one row are all connected to the same gate line GL. To one gate line GL, therefore, a plurality of TFTs MP arrayed in the gate line GL direction are connected. In this example, TFTs MP connected to one gate line GL(n) are arranged at positions closer to the gate line GL(n) to which the same are connected, than to the gate lines GL(n+1), GL(n−1) that are adjacent thereto.

In the example illustrated in FIG. 5, the gate driver 11 for driving the gate line GL(n) in the n'th row, is arranged at a position closer to the gate line GL(n+1) in the (n+1)'th row, than to the gate line GL(n) in the n'th row, More specifically, a plurality of TFTs, i.e., TFTs M1 to M11, included in the gate driver for the gate line GL(n) are arranged in a pixel array aligned along, not the gate line GL(n), but another gate line GL(n+2). Between the pixel array along this another gate line GL(n+2) and a pixel array along the gate line GL(n) driven by the gate driver of TFTs M1 to M11, still another pixel array (the pixel array in the (n+1)'th row) is arranged. In this way, between one gate line GL(n) and TFTs M1 to M11 of the gate driver that drives the gate line GL(n), at least one gate line GL(n+1) is arranged. Thus, between a gate driver and a gate line corresponding to the gate driver, at least a pixel array corresponding to another gate line is arranged.

In the example illustrated in FIG. 5, not only TFTs M1 to M11 of the gate driver corresponding to the gate line GL(u), but also the capacitor Cbst as well as the accumulation lines netA, netB, are arranged at positions closer to another gate line GL(n+1) or GL(n+2), than to the gate line GL(n). This makes it possible to set a gate line to which a driving signal is output from a gate driver, apart from the TFTs, the capacitor, and the lines included in the foregoing gate driver, with at least one pixel therebetween. This makes it possible to provide a greater distance between TFTs MP connected to the gate line GL(n), and TFTs M1 to M11 of a corresponding gate driver whose switching timings tend to coincide with those of the TFTs MP. This makes it possible to arrange TFTs, a capacitor, and lines of a gate driver whose potential changes at the same timings as the TFTs MP, at positions apart from the TFTs MP to such an extent that influences thereof are not exerted to the TFTs MP.

Figure 6:
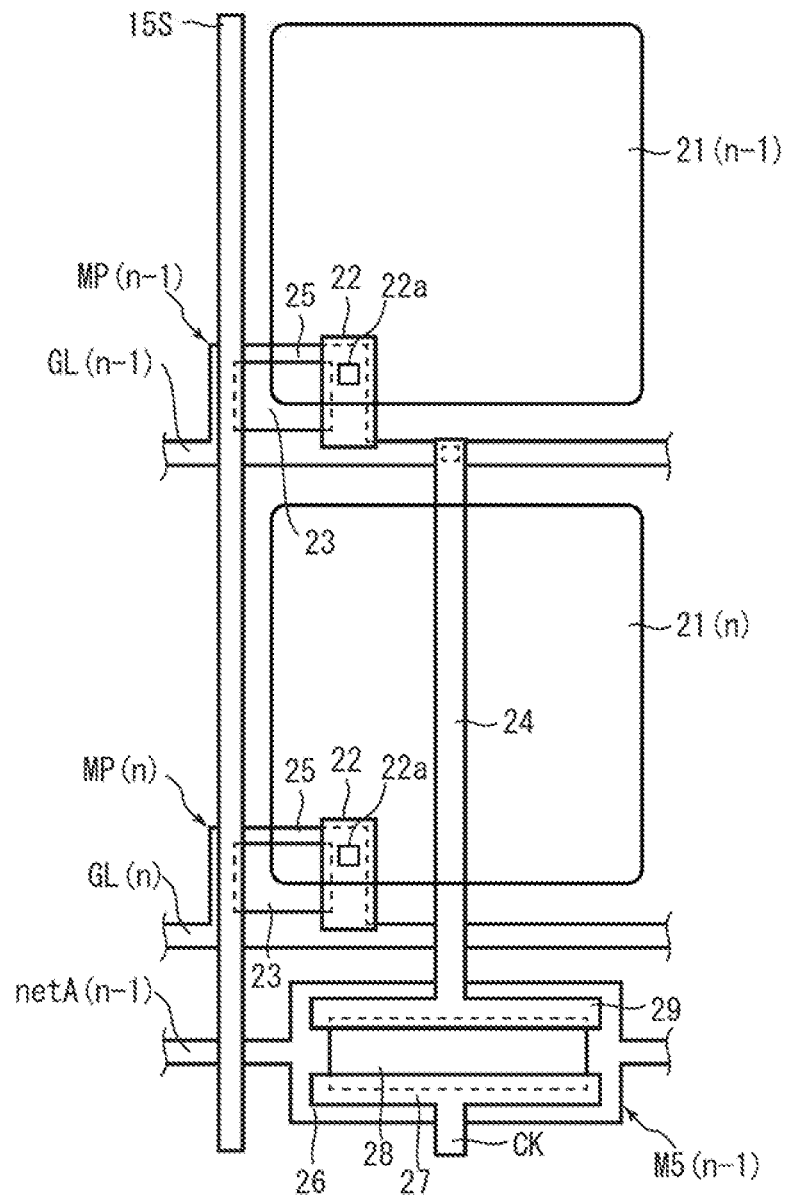
FIG. 6 illustrates an exemplary circuit configuration around TFT M5 illustrated in FIG. 5.

FIG. 6 illustrates an exemplary circuit configuration around TFT M5 illustrated in FIG. 5. In the example illustrated in FIG. 6, at positions where the source line 15S and the gate lines GL intersect, the gate lines GL have a greater line width, thereby forming gate electrodes 25 of the pixel-TFTs MP. At positions overlapping the gate electrodes 25, semiconductor layers 23 are provided with insulating films (not shown) being interposed therebetween. In a part of each semiconductor layer 23, a source electrode formed integrally with the source line 15S, and a drain electrode 22, are stacked and arranged. The drain electrode 22 is connected with the pixel electrode 21 through a contact hole 22a. Thus, the pixel-TFT MP is provided in such a manner than a corner thereof is positioned at a position where the source line 15S and the gate line GL intersect with each other.

TFT M5(n−1) that composes the gate driver corresponding to the gate line GL(n−1) is arranged at a position closer to the gate line GL(n), than to the gate line GL(n−1). In other words, between TFT M5(n−1) and the gate line GL(n−1), there are arranged the gate line GL(n) adjacent to the gate line GL(n−1), as well as the pixel-TFTs MP(n) and the pixel electrodes 21(n) connected to the gate line GL(n).

TFT M5(n−1) includes a gate electrode 28, a semiconductor layer 28 provided at a position overlapping the gate electrode 28 with an insulating film being interposed therebetween, as well as a source electrode 29 and a drain electrode 27 that are provided on the semiconductor layer 28 so as to be kept apart from each other and opposed to each other. The gate electrode 28 is formed on netA(n−1), which is arranged so as to be opposed to the gate line GL(n) and extend along the gate line GL(n), at a position where netA(n−1) has a greater line width. A line 24 that connects the source electrode 29 of TFT M5(n−1) and the gate line GL(n−1) with each other straddles the gate line GL(n) and the pixel electrode 21(n) connected to the gate line GL(n), and extends to the gate line GL(n−1). To the drain electrode 27 of TFT M5(n−1), a clock signal line CK that supplies a clock signal is connected. In the example illustrated in FIG. 6, capacity coupling occurs between TFT M5(n−1) and the pixel-TFTs MP(n).

(Operation Example)

Figure 7:
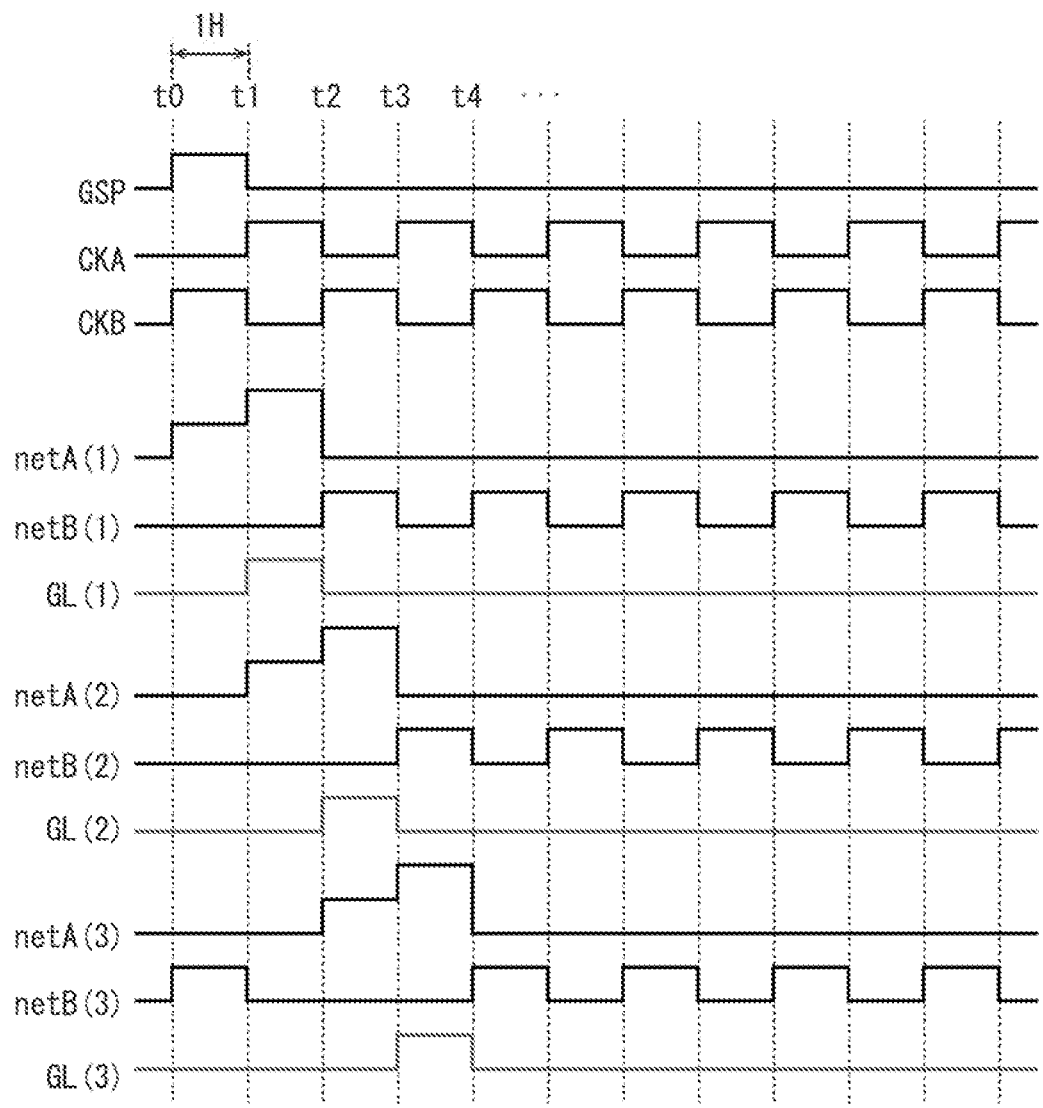
FIG. 7 is a timing chart illustrating exemplary signal waveforms for the gate driver 11 illustrated in FIGS. 4 and 5 during operation.

FIG. 7 is a timing chart illustrating an exemplary signal waveform of the gate driver 11 illustrated in FIGS. 4 and 5 during operation. In the description below, the low level as a signal level is referred to as a L level, and the high level is referred to as a H level. The gate driver illustrated in FIGS. 4 and 5 is an example of a gate driver using two-phase clock (CK). FIG. 7 illustrates waveforms of two clock signals CKA, CKB having phases different from each other. In the example illustrated in FIG. 7, the clock signals CKA, CKB have a pulse width of 1H. The GSP is assumed to rise at t0, and times of every 1H thereafter are referred to as t1, t2, . . . . Here, 1H can be set to a value obtained by dividing a vertical scanning cycle by the number of the, gate lines 13G.

Before time t0, the clock signals CKA and CKB are at the L level, and all of netA(1), netB(1) and GL(1) are at the L level.

At time t0, the clock signal (CKA) falls to the L level and the clock signal (CKB) rises to the H level, which causes GSP to be input to the gate and drain of TFT M1 of the gate driver on the first stage. With this, TFT M1 is turned ON and netA(1) is charged to the H level. Further, since TFT M11 is turned ON, TFT M8 is turned ON, and TFT M9 is turned OFF, netB(1) is in a state of being maintained at the L level. Since TFT M4 and TFT M5 are turned OFF, the potential of netA(1) does not fall and is maintained. During this period, TFT M7 is turned ON, and the potential of the gate line GL(1) is at the L level.

At time t1, the clock signal (CKA) rises to the H level and the clock signal (CKB) falls to the L level, which causes TFT M5 to be turned ON, and TFT M7 to be turned OFF. Since the capacitor Cbst is provided between netA(1) and the gate line GL(n), netA(1) is charged to a potential higher than the H level of the clock signal (CKA), along with the rise of the potential of the drain of TFT M5. During this period, since TFT M8 and TFT M1 are turned OFF and TFT M9 is turned ON, the potential of netB(1) is maintained at the L level. Since TFT M4 is in an OFF state, the potential of netA(1) does not fall, and the potential at the H level of the clock signal (CKA) is output to the gate line GL(1). This causes the gate line GL(1) to become in a selected state, and the set signal S to be output to the gate driver 11 of the gate line GL(2) on the next stage. As a result, netA(2) of the gate driver of the next stage is precharged to a voltage level that is lower than the H level by a threshold value of TFT M1.

At time t2, the clock signal (CKA) falls to the L level and the clock signal (CKB) rises to the H level, which causes TFT M8 to be turned ON and TFT M9 to be turned OFF, whereby netB is charged to the H level. This causes TFT M4 to be turned ON and netA(1) is charged to the L level. During this period, since TFT M7 is turned ON and TFT M5 is turned OFF, the potential at the L level is output to the gate line GL(1), and the gate line GL(1) is charged to the L level. The gate line GL(1) returns to the non-selected state.

Further, at time t2, TFT M5 of the next stage is turned ON in response to the potential of netA(2) at or higher than the H level, and a voltage at the H level of the clock signal (CKB) is output to the gate line GL(2). At time t3, the potential of the gate line GL(2) falls from the H level to the L level, whereby the gate line GL(2) shifts to the non-selected state, while the potential of the Late line GL(3) rises from the L level to the H level, whereby the gate line GL(3) shifts to the selected state. Thereafter, the gate lines GL(1) to (N) are sequentially selected in the same manner, in accordance with the cycles of the clock signals.

In this way, the liquid crystal display device 1 sequentially scans the gate lines 13G by using a plurality of the gate drivers 11 connected to each gate line 13G, and supplies data signals to each source line 15S by using the source driver 3, thereby causing an image to be displayed on the display panel 2. In the present embodiment, in the display region, a plurality of gate drivers 11 for driving one gate line 13G are formed in a space between the gate lines 13G. Even in a case where the lengths of the gate lines 13G are determined according to the width of the outer shape of the display panel 2, the gate lines 13G are sequentially selected one by one according to the set signal output from the gate drivers 11 in the display region.

Further, the control signals such as the clock signals, the power source voltage signal, and the like supplied to each gate driver 11 are input from one side of the display panel 2, which is the side where the source driver 3 is provided. This makes it possible to narrow the frame regions on the three sides where the source driver 3 is not provided. Thus, the design of the outer shape of the display panel 2 is not limited by the arrangement of the gate drivers 11, whereby the degree of freedom in design can be increased.

(Effects of Embodiment)

Figure 8:
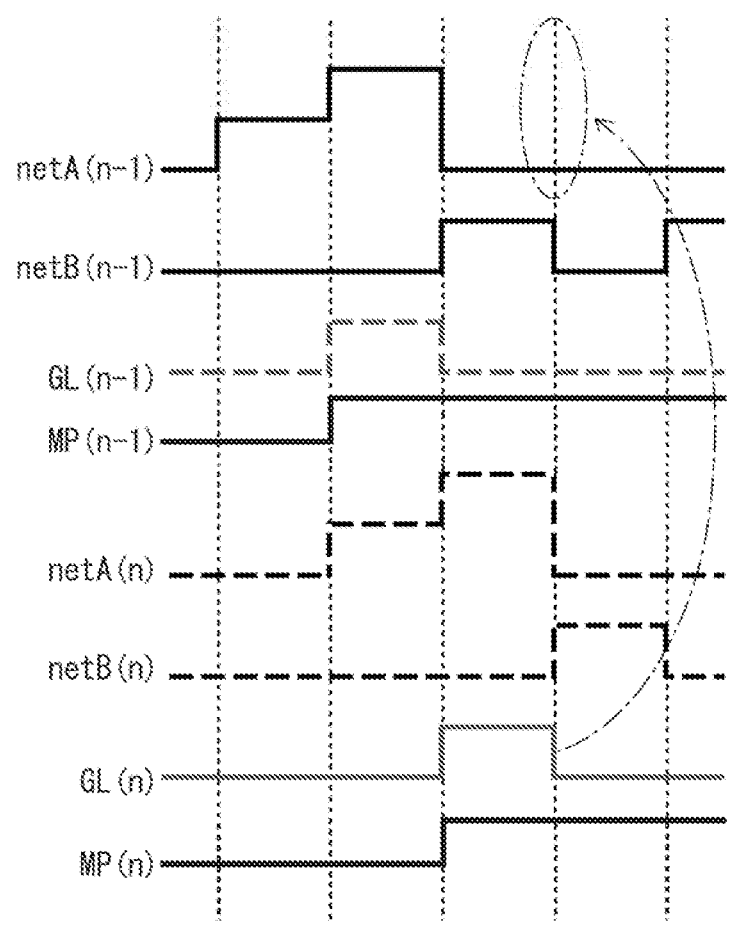
FIG. 8 is a timing chart illustrating signals for gate lines and gate driver elements corresponding to the same.

FIG. 8 is a timing chart illustrating signals for the gate lines GL(n−1) and GL(n) arranged as illustrated in FIG. 6, as well as netA and netB of the gate drivers corresponding to the same. FIG. 8 illustrates an exemplary case where the gate drivers operate in a manner illustrated in the timing chart of FIG. 7. When the potential of the gate line GL(n−1) rises from the L level to the H level, the pixel-TFTs MP connected to the gate line GL(n−1) shift from the OFF state to the ON state. During a period while the pixel-TFTs MP are in the ON state, a signal voltage according to luminance to be displayed is applied to the pixel electrodes 21, through the source lines 15S. When the potential of the gate line GL(n−1) falls from the H level to the L level, the pixel-TFTs MP shift from the ON state to the OFF state. After the pixel-TFTs MP shift to the OFF state as well, the voltage applied to the pixel electrodes 21 is maintained.

In the example illustrated in FIG. 8, when the potential of the gate line GL(n) falls from the H level to the L level, potentials of TFT M5(n−1) and netA(n−1) of the gate driver in the vicinity of the gate line GL(n) (see FIG. 6) do not change. Even if capacity coupling occurs between the gate line GL(n) and TFT M5(n−1) or netA(n−1), influences of potential changes in TFT M5(n−1) or netA(n−1) are hardly exerted to the operations of the pixel-TFTs MP(n).

In other words, regarding influences of capacity coupling at the pixel TR(n) in the n'th row, there is substantially no influence from the gate driver that drives the gate line GL(n) in the n'th row, but there are some influences from the gate driver that drives the gate line GL(n−1) in the (n−1)'th row. Here, as illustrated in FIG. 8, at a timing when the pixel-TFTs MP(n) of the pixels TR(n) in the n'th row shift from ON state to OFF state, the potential of netA of the gate driver that drives the gate line GL(n−1) of the (n−1)'th row (the node having the greatest potential change among the nodes in the gate driver) does not change. It is therefore unlikely that influences of pull-in by the gate driver would remain in the pixel electrode and be held.

Figure 9:
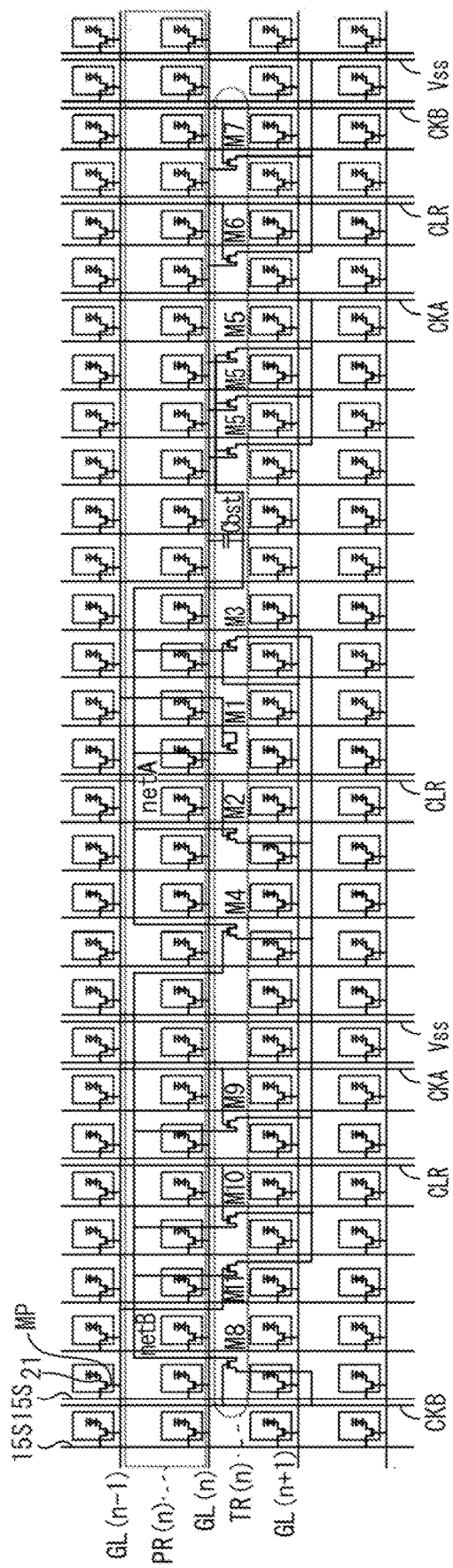
FIG. 9 illustrates an exemplary circuit configuration in a case where a gate driver is arranged so that the gate line that the gate driver drives is closest to the gate driver.
Figure 10:
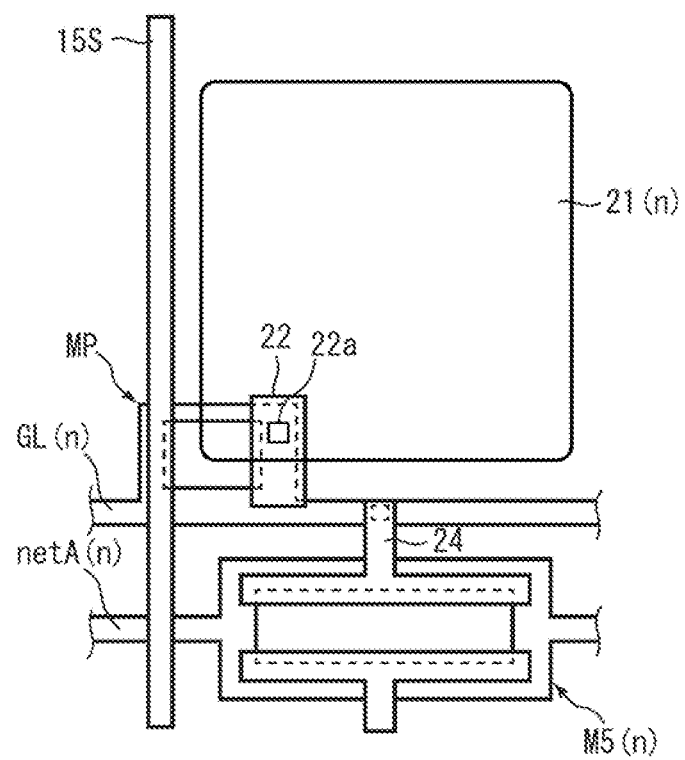
FIG. 10 illustrates an exemplary circuit configuration around TFT M5 illustrated in FIG. 9.

FIG. 9 illustrates, as a comparative example, an exemplary circuit configuration in a case where a gate driver is arranged so as to be closest to the gate line that the gate driver drives. In the example illustrated in FIG. 9, a TFT-arranged region TR(n) where TFTs of the gate driver that drive the gate line GL(n) in the n'th row are arranged is arranged at a position closest to the gate line GL(n), rather than to the other gate lines. FIG. 10 illustrates an exemplary circuit configuration around TFT M5 illustrated in FIG. 9. TFT M5(n) of the gate driver is arranged so that the gate tine GL(n) that the gate driver drives is closest to the gate driver.

When the gate driver having a configuration illustrated in FIGS. 9 and 10 operates in the same manner as illustrated in the timing charts illustrated in FIGS. 7 and 8, M5(n) shifts from the ON state to the OFF state simultaneously at the timing when the pixel-TFT M5(n) shifts from the ON state to the OFF. In the case of the configuration illustrated in FIG. 10, capacity coupling occurs between the pixel-TFT MP(n) and TFT M5(n).

Figure 11:
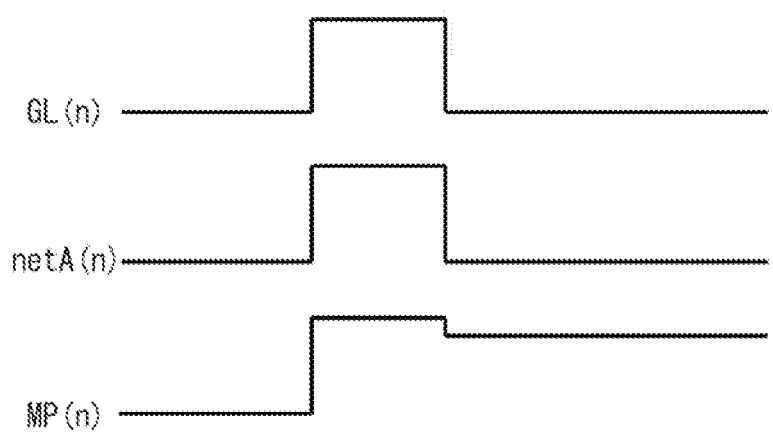
FIG. 11 illustrates an exemplary case where the pixel electrode has a potential that is different from a proper potential that the pixel electrode is supposed to have.

Therefore, in the case of the pixel TR(n) near which there is a gate driver, when potentials of the elements (the line netA, the capacitor Cbst, the control line for the clock signal (CK), and the like) of the gate driver arranged around the pixel-TFT MP(n) and the pixel electrode 21(n) change at the timing when the pixel-TFT MP(n) shifts from the ON state to the OFF state, the potential of the pixel electrode 21(n) changes due to influences of capacity coupling. If the pixel-TFT MP(n) is turned OFF in the foregoing state, the pixel electrode 21(n) holds a potential that is different from the proper potential that the source line 15S is supposed to have. FIG. 11 illustrates an exemplary case where the pixel electrode has a potential different from the proper potential that the pixel electrode is supposed to have. This causes the pixel TR(n) to have a different luminance as compared with the luminance of the pixels near which there is no gate driver, and results in display irregularities visible in the panel.

For example, in a case where netA(n) of the gate driver that drives the gate line GL(n) in the n'th row, and the pixel TR(n) in the n'th row, (in particular, the pixel-TFT MP(n), the common electrode, and the pixel electrode 21(n)) have a relatively large parasitic capacitance, the potential of netA(n) changes at a timing immediately before the pixel-TFT MP(n) in the n'th row shifts from the ON state to the OFF state, and the pixel-TFT MP(n) is turned off and holds charges while being in a state of including influences of the pull-in of netA(n). The voltage value of the pixel electrode after the pixel-TFT MP(n) is turned off is therefore different, as compared with the pixels where no netA(n) is arranged, which is visible as display irregularities.

In contrast, in the case of the configuration illustrated in FIGS. 5 and 6, the gate driver 11(n) that drives a certain gate line GL(n) is arranged in the vicinity of gate lines GL(n+1) or GL(n−1), which is other than the gate line GL(n). More specifically, in the vicinity of the pixels of the (n+1)'th row driven by the gate line GL(n+1), or the pixels of the (n−1)'th row driven by the gate line GL(n−1), the gate driver 11(n) that drives the gate line GL(n) is arranged.

By setting the position of the gate line GL(n) and the position of the gate driver 11(n) that drives the gate line GL(n) apart from each other in this way, it is made possible to prevent potential changes from occurring to the gate driver elements arranged in the vicinity of the pixel-TFTs MP(n) and the pixel electrodes 21(n) at a timing when the pixel-TFTs MP(n) shift from the ON state to the OFF state. This leads to the elimination of the pull-in caused by capacity coupling, thereby preventing display irregularities from occurring.

Incidentally, in a case where potentials of the gate driver elements near the pixel-TFT MP(n) change when the pixel-TFT MP(n) is in ON state, the potential of the pixel electrode 21(n) returns to the proper potential level since the pixel electrode 21(n) is connected with the source line 15S, even if influences due to capacity coupling are exerted to the pixel electrode 21(n). Further, in a case where potentials of the gate driver elements near the pixel-TFT MP(n) change when the pixel-TFT MP(n) is in OFF state and influences are exerted to the potential of the pixel electrode 21(n), influences in the positive and negative directions are alternately exerted thereto, and hence the potential changes are canceled. This causes the influences on the display quality to decrease. For this reason, with such a configuration that any gate driver element whose potential changes at the same timing as the timing at winch the state of the pixel-TFT MP(n) changes is not arranged in the vicinity of the pixel-TFT MP(n), it is possible to effectively suppress the deterioration of display quality.

(Modification Example)

In the example illustrated in FIG. 5, all of the TFTs M1 to M11 of the gate driver 11(n) corresponding to the gate line GL(n) are arranged at positions closer to another gate line GL(n+1), than to the gate line GL(n). In contrast, it is possible to provide, for example, a configuration in which, among TFTs M1 to M11 of the gate driver 11(n), TFTs that have potentials changing at the same timings as the timings of the pixel-TFTs MP(n) can be arranged at positions closer to another gate line (for example, GL(n+1)), than to the corresponding gate line GL(n).

An exemplary configuration is as follows: the TFT M5 of the output unit U1 (last buffer) is arranged in the vicinity of the another gate line GL(n+1), and the other TFTs M1 to M4, and M6 to M7 are arranged in the vicinity of the gate line GL(n) corresponding to the gate driver 11(n). In this case, netA as an accumulation line connected to the last buffer can be arranged in the vicinity of a gate line other than the gate line GL(n). Besides, TFT M5, the capacitor Cbst, and the line netA of the output unit U1 may be arranged in the vicinity of a gate line other than the corresponding gate line GL(n), whereby the elements that highly possibly influence the pixel electrode 21(n) can be set apart from the pixel-TFTs MP(n) of the pixel electrodes 21(n).

Further, in the example illustrated in FIG. 5, not only TFTs M1 to M11 of the gate driver 11(n), but also the capacitor Cbst, are arranged at positions closer to the another gate line GL(n+1), than to the gate line GL(n) driven by the gate driver 11(n). Thus, the configuration can be such that at least either the TFTs or the capacitor of the gate driver 11(n) is arranged at a position closer to the another gate line GL(n+1), than to the gate line GL(n) that the gate driver 11(n) drives. For example, even with a configuration in which only the capacitor Cbst is arranged at a position closer to the another gate line GL(n+1), than to the gate line GL(n) driven by the gate driver 11(n), the above-described effects can be achieved. Still further, the capacitor arranged at a position closer to another gate line is not limited to the capacitor of the last buffer. A capacitor formed when a conductive member connected to TFT of the gate driver 11(n) is arranged so as to be opposed to another conductive member can be arranged at a position closer to another gate line, as described above.

In the example illustrated in FIGS. 5 and 6, between TFT or a capacitor of the gate driver 11(n) and the gate line GL(n) corresponding to the gate driver 11(n), there is arranged another gate line G(n+1). In contrast, the configuration may be such that another gate line is not arranged between TFT or the capacitor of the gate driver 11(n) and the corresponding gate line GL(n).

Figure 12:
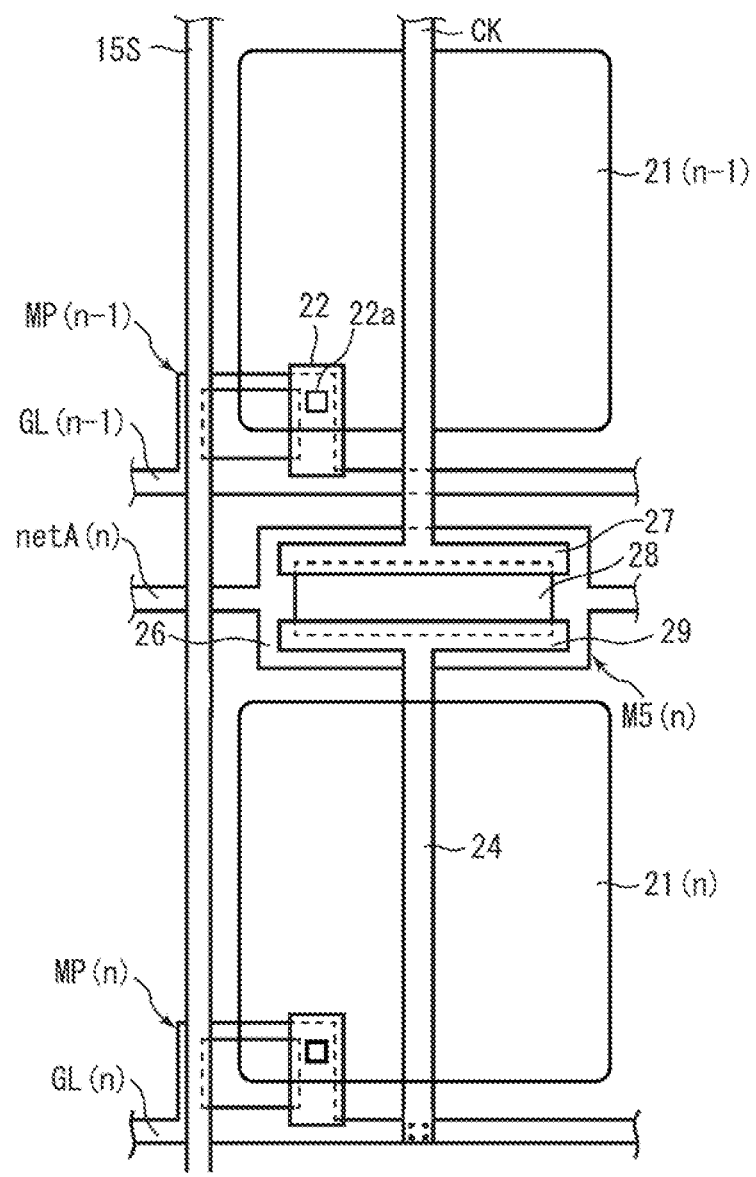
FIG. 12 illustrates a modification example of the arrangement of TFT M5(n) of the gate driver 11(n).

FIG. 12 illustrates a modification example of the arrangement of TFT M5(n) of the gate driver 11(n). In the example illustrated in FIG. 12, no gate line is arranged between TFT M5(n) as well as netA(n), and the corresponding gate line GL(n) driven by these. Between TFT M5(n) as well as netA(n), and the corresponding gate line GL(n), the pixel electrode 21(n) connected to the gate line GL(n) is arranged. On one side of the pixel electrode 21(n) opposed to the gate line GL(n), the pixel-TFT MP(n) is arranged. At a position opposed to a side of the pixel electrode 21(n), the side being opposite to the gate line GL(n) side, TFT M5(n) is arranged. A line 24 that connects the gate line GL(n) and the source electrode 29 of TFT M5(n) with each other is provided at a position overlapping the pixel electrode 21(n) in plan view.

Further, the clock signal line CK connected to the drain electrode 27 of the TFT M5(n) is formed at a position overlapping the pixel electrode (n−1) adjacent thereto in plan view so as to extend in the same direction as the source line 15S. In this example, capacity coupling can occur between TFT M5(n) and the pixel-TFT MP(n−1). Here, since operation timings of the pixel-TFT MP(n−1) and those of TFT M5(n) are different, potential changes of TFT M5(n) do not significantly influence the potential of the pixel electrode 21(n).

Embodiment 2

Figure 13:
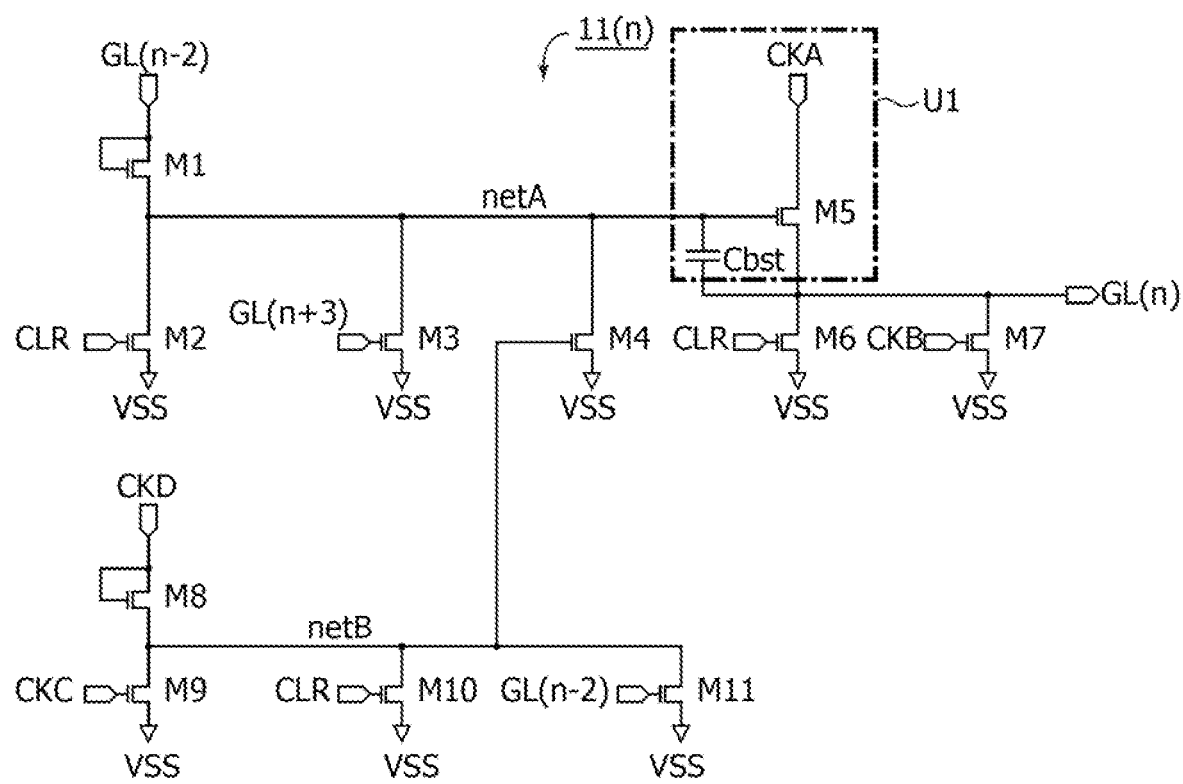
FIG. 13 illustrates an exemplary equivalent circuit of a gate driver 11 in Embodiment 2.

FIG. 13 illustrates an exemplary equivalent circuit of a gate driver 11 according to Embodiment 2. The gate driver illustrated in FIG. 13 has a configuration of a gate driver that operates with a four-phase clock (CK). Regarding parts identical to those of the equivalent circuit illustrated in FIG. 4, descriptions are omitted. In the example illustrated in FIG. 13, the drain and the gate of TFT M1 connected to netA are connected to the gate line GL(n−1) of the previous stage. Further, to the gate of TFT M3, the gate line GL(n+3), which is three stages ahead, is connected. Still further, to the drain and the gate of TFT M8, the control line for the clock signal CKD is connected, and to the gate of TFT M9, the control line for the clock signal CKC is connected. Still further, the gate line GL(n−2), which is two stages behind, is connected to the gate of TFT M11.

Figure 14:
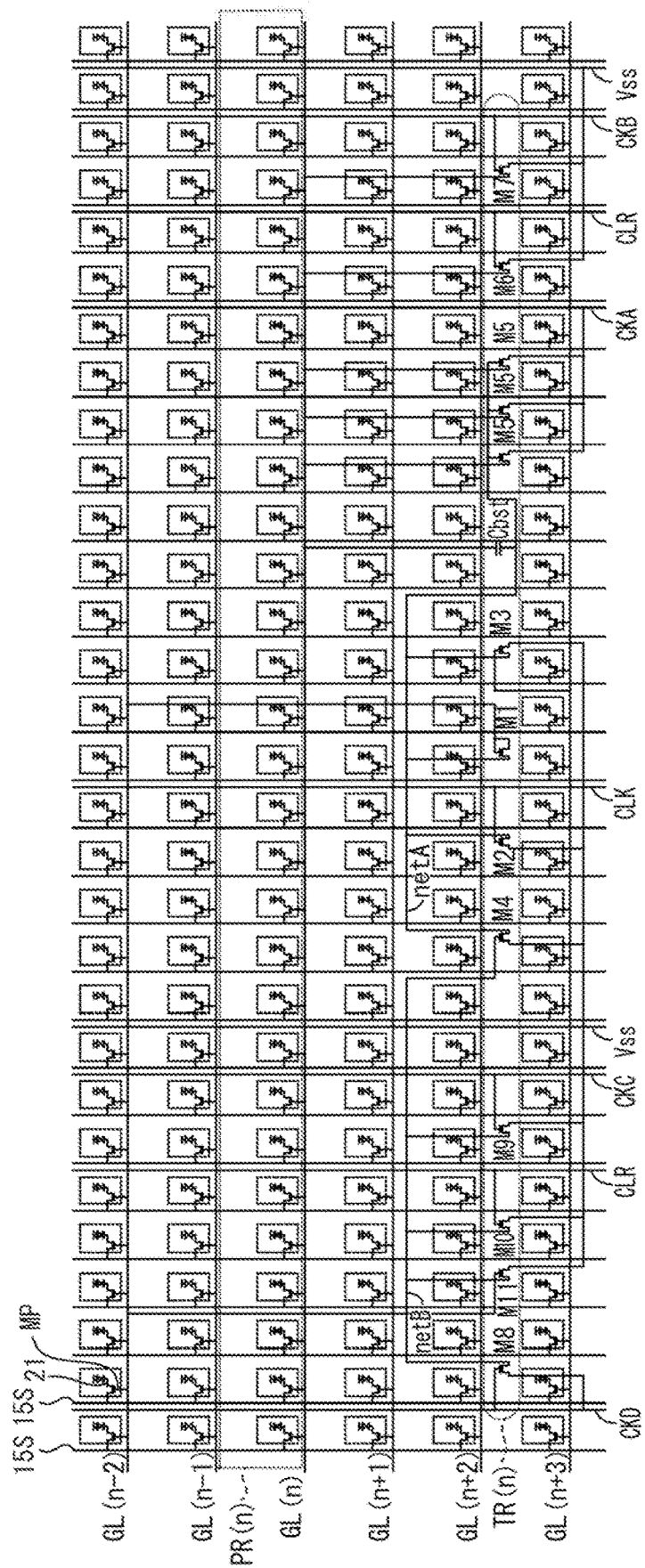
FIG. 14 illustrates an exemplary circuit configuration in a case where the gate driver illustrated in FIG. 13 is arranged in the display region.

FIG. 14 illustrates an exemplary circuit configuration in a case where the gate driver illustrated in FIG. 13 is arranged in the display region. In the example illustrated in FIG. 14, TFTs M1 to M11 and the capacitor Cbst of the gate driver 11(n) that drives the gate line GL(n) in the n'th row, are arranged at a position closer to the gate line GL(n+2), which two stage behind with respect to the gate line GL(n). Between TFTs M1 to M11 as well as the capacitor Cbst, and the corresponding gate line GL(n), two gate lines GL(n+1) and GL(n+2) are arranged. The lines netA and netB of the gate driver 11(n) are partially arranged at positions along the gate line GL(n+1). In this example, a TFT-arranged region TR(n) where TFTs of the gate driver 11(n) are arranged is two pixels apart from the pixels PR(n) of the gate line GL(n) that the gate driver 11(n) drives.

Figure 15:
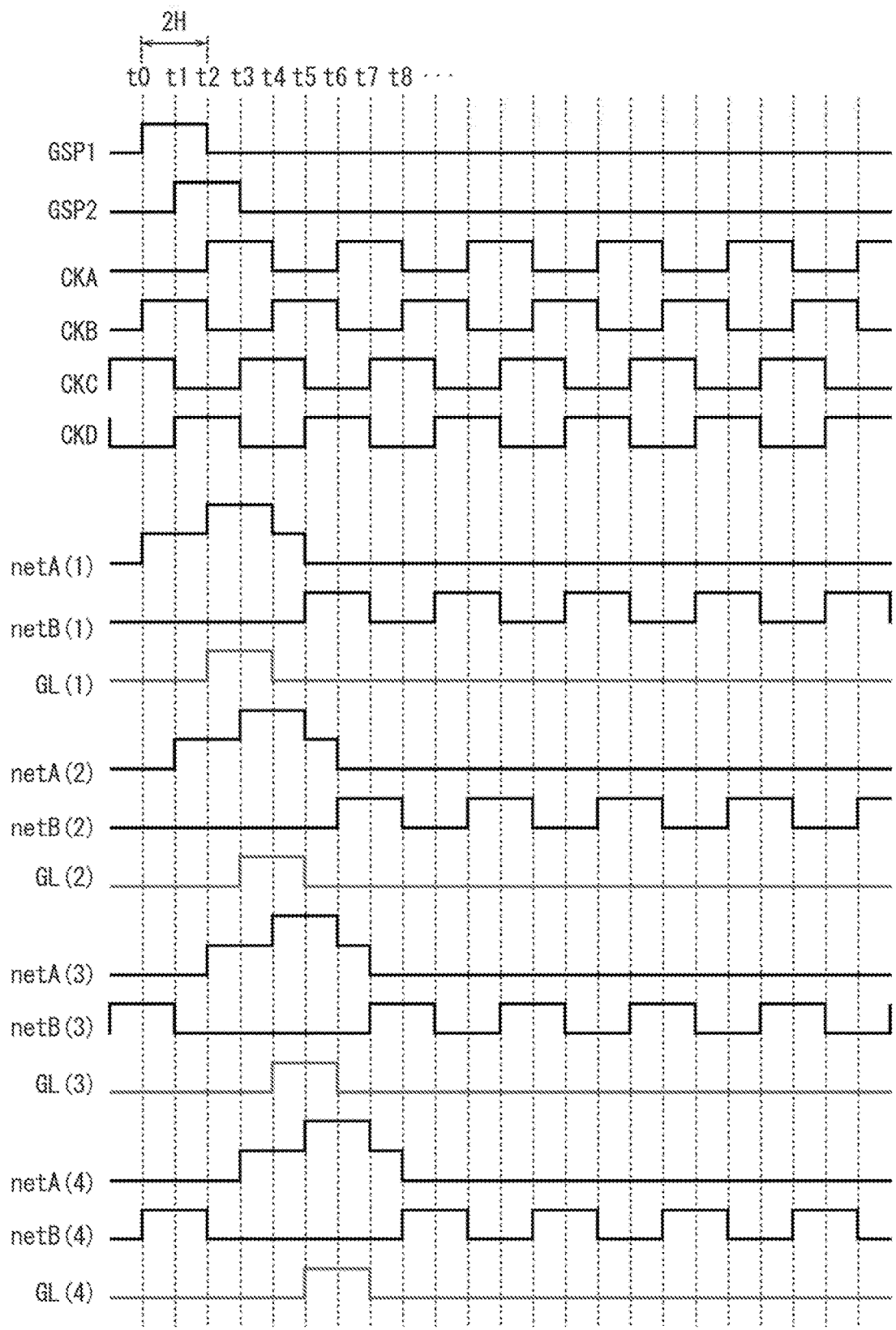
FIG. 15 is a timing chart illustrating exemplary signal waveforms for the gate driver 11 illustrated in FIGS. 13 and 14 during operation.

FIG. 15 is a timing chart illustrating exemplary signal waveforms for the gate driver 11 illustrated in FIGS. 13 and 14 during operation. In the example illustrated in FIG. 7, the clock signals CKA, CKB, CKC, and CKD have a pulse width of 2H. The clock pulses CKA and CKB have phases opposite to each other, and the clock pulses CKC and CKD also have phases opposite to each other. The clock pulses CKA and CKC have phases that are shifted from each other by ¼ wavelength. The clock pulses CKB and CKD also have phases that are shifted from each other by ¼ wavelength.

In the example illustrated in FIG. 15, when CKA first rises from the L level to the H level at time t2, potentials of netA(1) of the first gate driver 11(1) and the gate line GL(1) rise from the L level to the H level. Thereby, the gate line GL(1) shifts to the selected state. At time t3, i.e., when 1H lapses from time t2, simultaneously when CKC rises, potentials of netA(2) of the gate driver 11(2) and the gate line GL(2) in the second row rise, and, when CKA returns from the H level to the L level at time t4, the gate line GL(1) also returns from the H level to the L level (returns to the non-selected state). Thereafter, sequentially, GL(3), GL(4), . . . are in the selected state for a period of 2H each, every time when 1H lapses.

Figure 16:
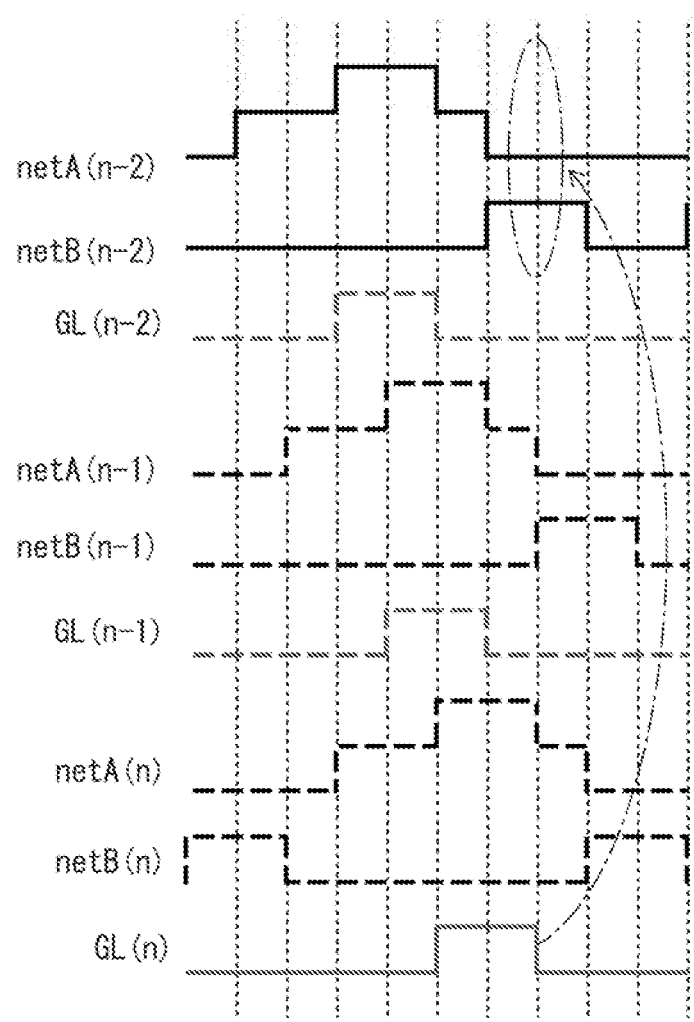
FIG. 16 is a timing chart illustrating signals for gate lines, and netA, netB of gate drivers corresponding to the gate lines, arranged as illustrated in FIG. 14.

FIG. 16 is a timing chart illustrating signals for gate lines GL(n−1), GL(n), and netA, netB of gate drivers corresponding to these gate lines, arranged as illustrated in FIG. 14. FIG. 16 illustrates an exemplary case where the gate drivers operate according to the timing chart illustrated in FIG. 15.

According to such an arrangement as illustrated in FIG. 14, for example, regarding the pixels (the pixels in the n'th row) driven by the gate line GL(n) in the n'th row, the gate driver 11(n−2) that drives GL(n−2) is arranged at a shorter distance to the pixels, than the gate driver 11(n) that drives GL(n) is. Regarding in of capacity coupling, the gate driver 11(n) that drives the gate line GL(n) in the n'th row has substantially no influence on the pixels of GL(n) but the gate driver 11(n−2) that drives the (n−2)'th gate line, i.e., the gate line GL(n−2), has influences on the pixels of GL(n). Here, in the example illustrated in FIG. 16, at a timing when the pixel-TFTs MP(n) in the n'th row shift from the ON state to the OFF state, that is, at a timing when the potential of the gate line GL(n) falls from H to L, the potentials of the accumulation lines netA and netB, which are internal nodes of the gate driver 11(n−2) that drives the (n−2)'th gate line, i.e., the gate line GL(n−2), do not change. Therefore, such a problem that influences of pull-in remain and are held in the pixel electrodes does not occur.

In the example illustrated in FIG. 8, at a timing when GL(n) falls from the H level to the L level, netB(n−1) changes. In a case where netB(n−1) is in the vicinity of the gate line GL(n), therefore, influences of netB possibly remain in the pixels of GL(n). In contrast, in the example illustrated in FIG. 16, at a timing when GL(n) falls from the H level to the L level, neither netA(n−2) nor netB(n−2)

changes. The pixels of GL(n), therefore, are influenced by neither netA(n−2) nor netB(n−2). In this way, by using a multiphase clock of four or more phases, influences of capacity coupling can be suppressed.

Further, in the present embodiment, pixel arrays of two rows are arranged between an area where the gate driver 11(n) is arranged, and the gate line GL(n) that the gate driver 11(n) drives. In this way, a pixel array where the gate driver 11(n) is arranged and the pixel array of the gate line GL(n) are arranged apart by one pixel from each other, but the same may be set apart by 2 pixels or more. As the distance therebetween increase, however, a distance through which a line that connects TFT M5, etc., of the output unit U1 and the gate line with each other is routed increases. As the line is longer, loads on the gate line increase. For this reason, it is desired that they are set apart at such a minimum distance that influences of capacity coupling can be reduced.

Figure 17:
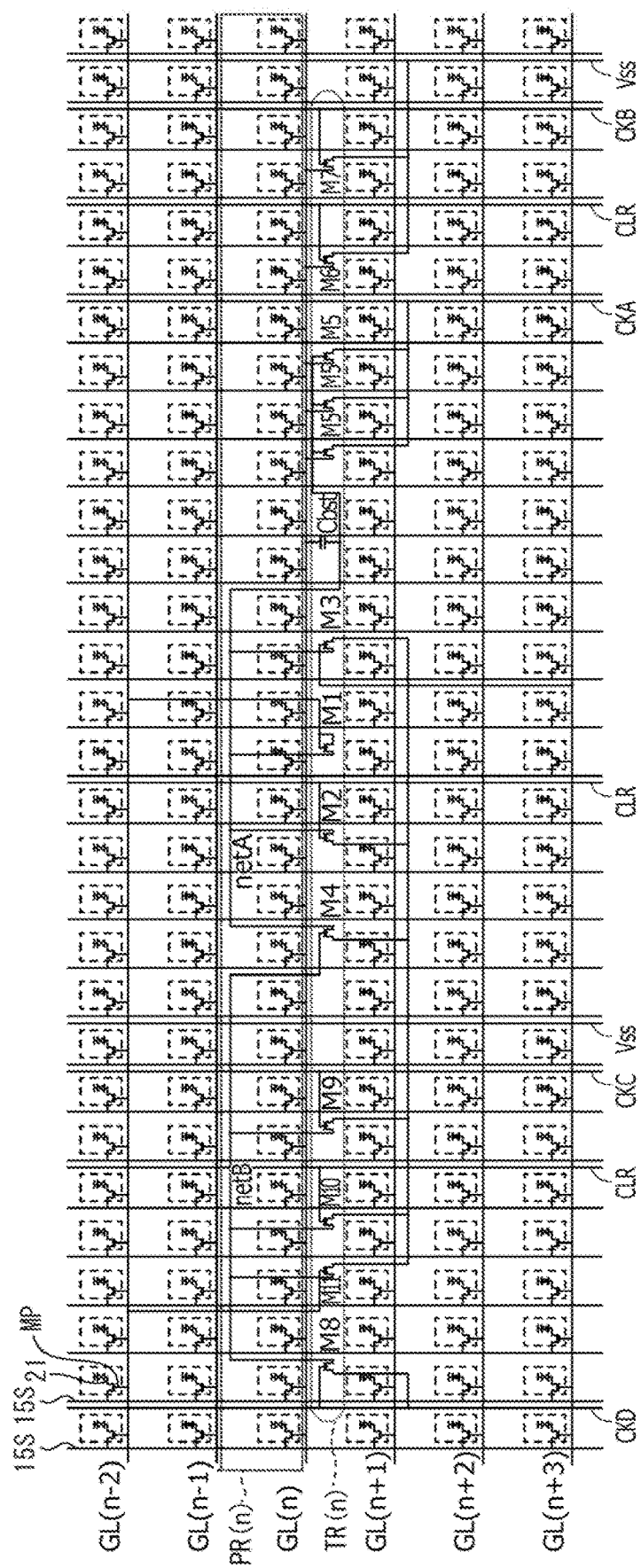
FIG. 17 illustrates an exemplary circuit configuration in a case where the gate driver illustrated in 13 is arranged so that the gate line that the gate driver drives is closest to the gate driver.

FIG. 17 illustrates an exemplary circuit configuration in a case where the gate driver illustrated in 13 is arranged so as to be closest to the gate line that the gate driver drives, as a comparative example. In the example illustrated in FIG. 17, a TFT-arranged region TR(n) for TFTs of the gate driver that drives the n'th gate line, i.e., the gate line GL(n), is arranged at the position closest to the gate line GL(n), as compared with the other gate lines. In this case, the lines that connect netA of the gate driver and TFTs M1 to M4 are arranged in the pixels of the gate line GL(n). The potential of netA that changes at the same time as a timing when the pixel-TFTs MP(n) of the gate line GL(n) shift from the ON state to the OFF state, influences the pixel voltage of the gate line GL(n). Further, TFT M5 of the last buffer is arranged at positions opposed to the pixel-TFT MP(n) of the gate line GL(n). At a timing when the pixel-TFTs MP(n) of the gate line GL(n) change, the potential of TFT M5 changes at the same time, thereby influencing the pixel voltage of the gate line GL(n). As a result, the possibility that display irregularities become visible increases.

Embodiment 3

Figure 18:
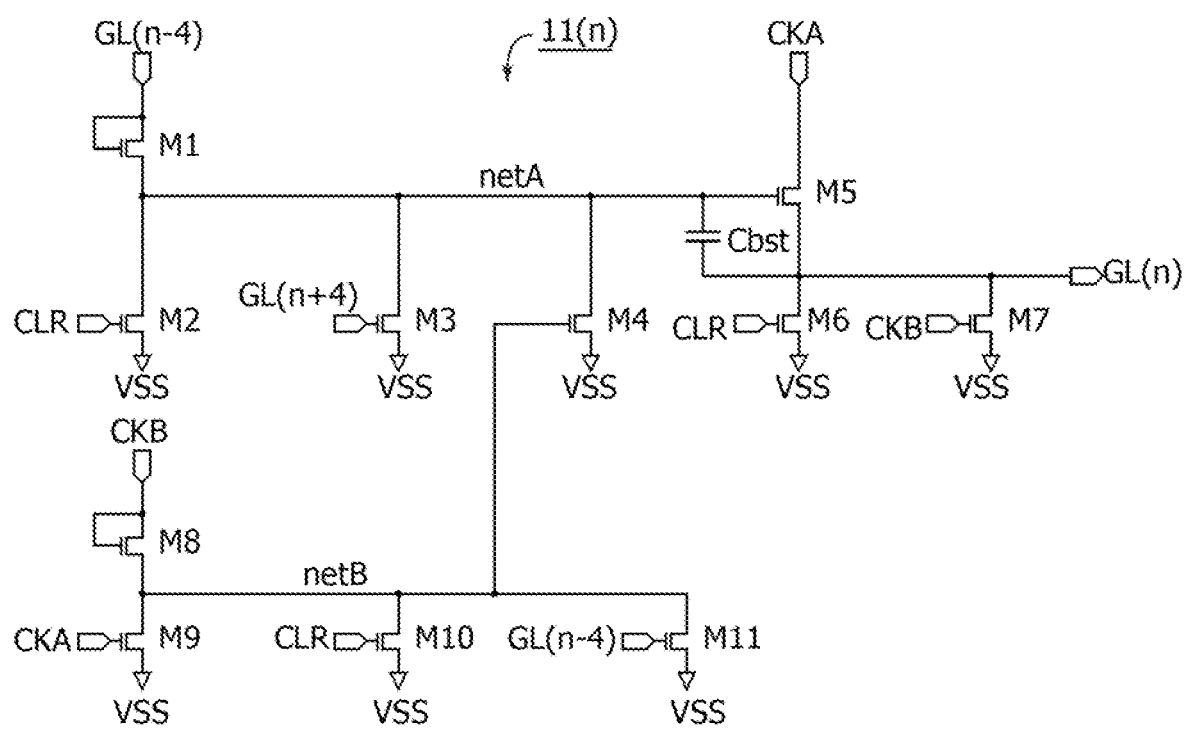
FIG. 18 illustrates an exemplary equivalent circuit of a gate driver 11 in Embodiment 3.

FIG. 18 illustrates an exemplary equivalent circuit of a gate driver 11 in Embodiment 3. The gate driver illustrated in FIG. 18 has a configuration of a irate driver that operates with an eight-phase clock (CK). Regarding parts identical to those of the equivalent circuit illustrated in FIG. 4, descriptions are omitted. In the example illustrated in FIG. 18, the drain and the gate of TFT M1 connected to netA are connected to the gate line GL(n−4), which is four stages behind. Further, the gate line GL(n+4), which is four stages ahead, is connected to the gate of TFT M3. Still further, the gate line GL(n−2), which is four stages behind, is connected to the gate of TFT M11.

To the gate driver 11(n+1) of the next stage to the gate driver 11(n) illustrated in FIG. 18, control lines for clock signals CKC, CKD are, connected, in place of the control lines for the clock signals CKA, CKB. The clock signals CKC, CKD can be signals that have phases shifted by ⅛ wavelength with respect to the phases of the clock signal CKA, CKB, respectively. Similarly, to the gate driver 11(n+2), control lines for clock signals CKE, CKF are connected, phases of the clock signals CKE, CKF being shifted by ⅖ wavelength with respect to the phases of the clock signals CKA, CKB. To the gate driver 11(n+3), control lines for clock signals CKG, CKH are connected, phases of the clock signals CKG, CKH being shifted by ⅜ wavelength with respect to the phases of the clock signals CKA, CKB.

The gate driver 11(n+5) can have the same configuration as that illustrated in FIG. 18 except that the clock signal CKA and the clock signal CKB are replaced with each other. Similarly, the gate drivers 11(n+6) to 11(n+8) can have the same configurations as those of the gate drivers 11(n+2) to 11(n+4), respectively, except that the foregoing two clock frequencies are replaced with each other.

Figure 19:
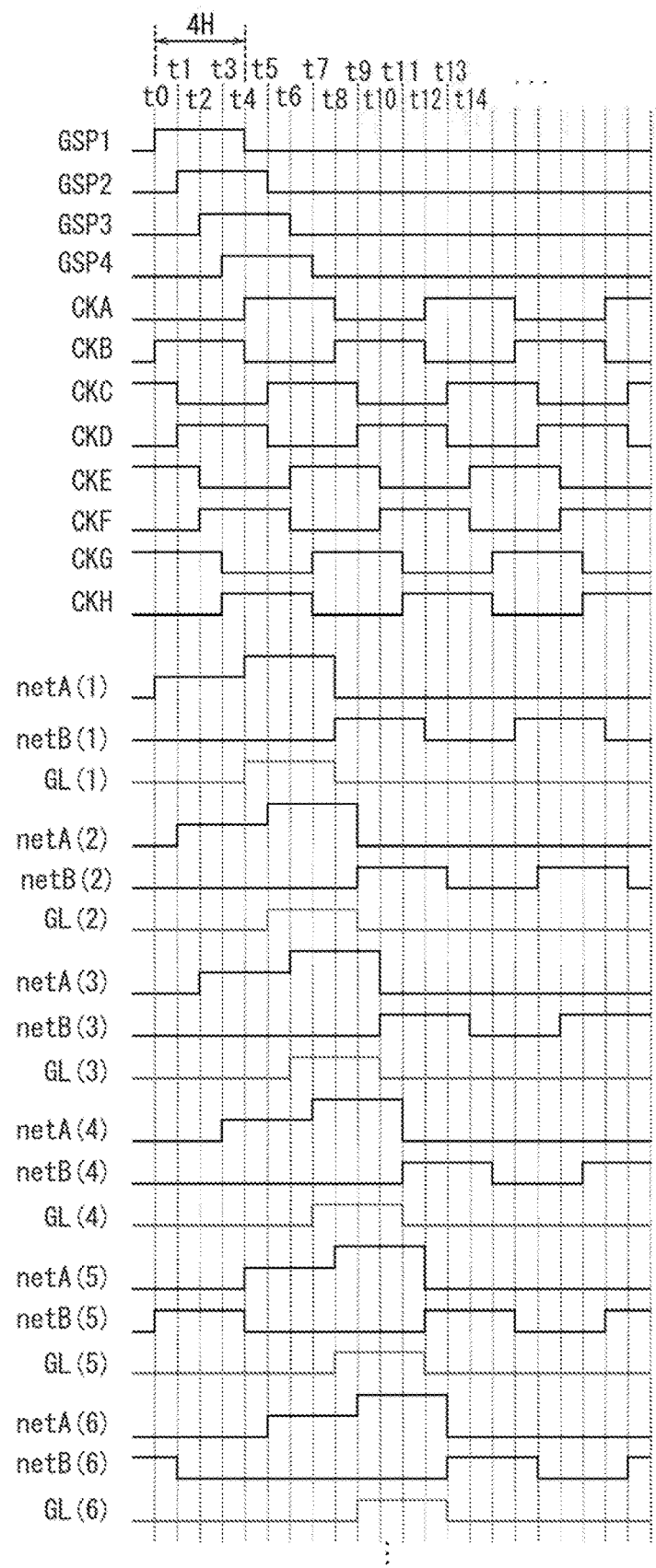
FIG. 19 is a timing chart illustrating exemplary signal waveforms for the gate driver 11 illustrated in FIG. 18 during operation.

FIG. 19 is a timing chart illustrating exemplary signal waveforms for the gate driver 11 illustrated in FIG. 18 during operation. In the example illustrated in FIG. 19, the clock signals CKA, CKB, CKC, CKD, CKE, CKF, CKG, and CKH have a pulse width of 4H. CKA and CKB have phases opposite to each other, and similarly, CKC and CKD, CKE and CKF, as well as CKG and CKH have opposite phases. The phases of CKA and CKC are shifted by ⅛ wavelength from each other. The phases of CKB and CKD also are shifted by ⅛ wavelength from each other. Similarly, the phases of CKC and CKE, the phases of CKD and CKF, the phases of CKE and CKG, and the phases of CKF and CKH are shifted from each other by ⅛ wavelength.

In the example illustrated in FIG. 19, when CKA first rises from the L level to the H level at time t4, potentials of netA(1) of the first gate driver 11(1) and the gate line GL(1) rise from the L level to the H level. Thereby, the gate line GL(1) shifts to the selected state. At time t5, i.e., when 1H lapses from time t4, simultaneously when CKC rises, potentials of netA(2) of the gate driver 11(2) and the gate line GL(2) in the second row rise. The gate line GL(2) shifts to the selected state. Similarly, at times t6, t7, t8, the gate lines GL(3), GL(4), and GL(5) shift to the selected state sequentially. At the same time when CKA returns from the H level to the L level at time t8, the gate line GL(1) also returns from the H level to the L level (returns to the non-selected state). Thereafter, sequentially, GL(6), GL(7), . . . are in the selected state for a period of 4H each, every time when 1H lapses.

Figure 20:
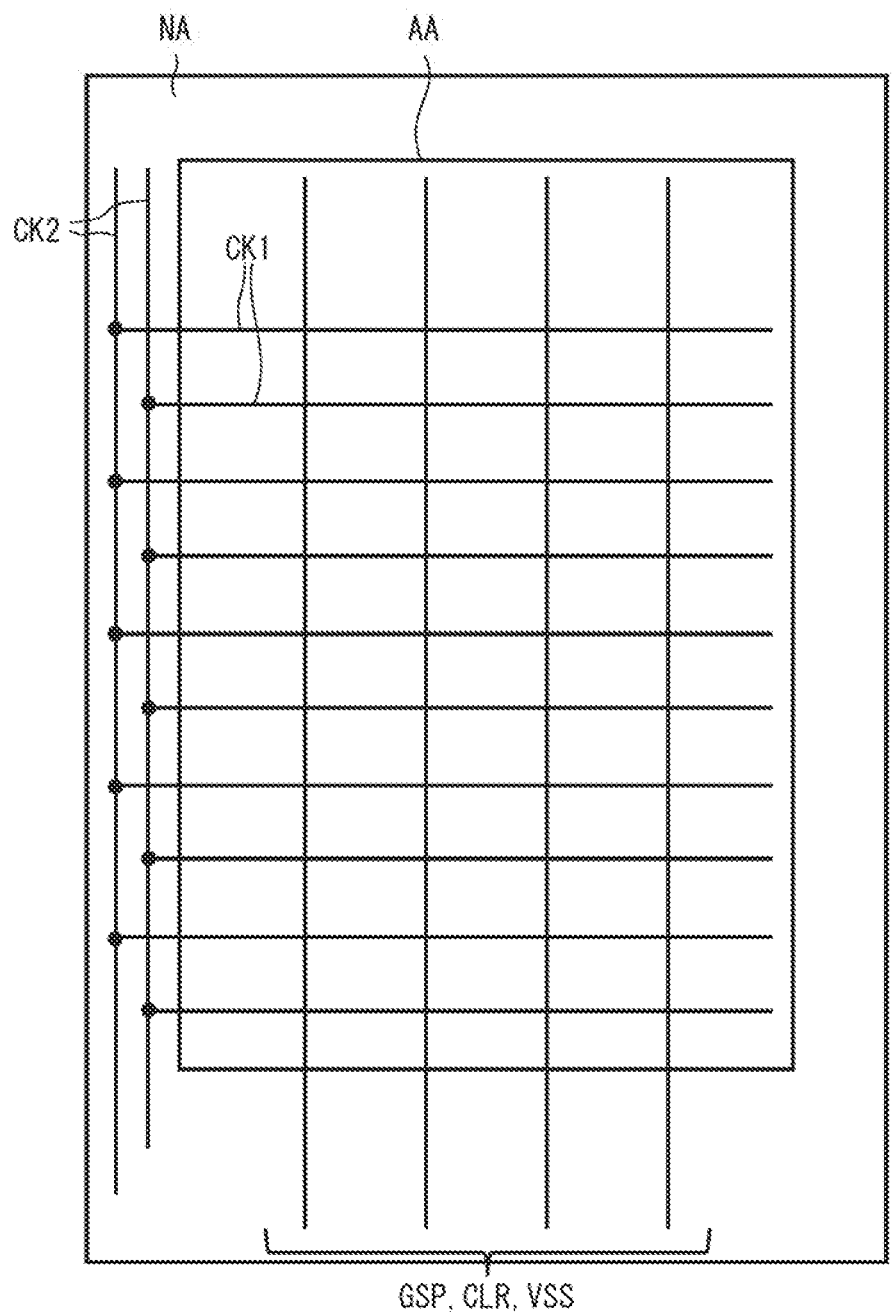
FIG. 20 illustrates an exemplary arrangement of control lines in the present embodiment.

FIG. 20 illustrates an exemplary arrangement of control lines in the present embodiment. In FIG. 20, control lines connected to the gate drivers arranged in the display region AA are illustrated, and the illustration of the other lines, such as the gate lines and the source lines, is omitted. The display panel illustrated in FIG. 20 is rectangular, but it may be non-rectangular, as illustrated in FIG. 1. The control lines include, for example, control lines for transmitting the clock signal CK, the gate start pulse GSP, the reset signal CLR, and the power source voltage signal VSS.

Among these control lines, the control line (clock signal line) for the clock signal CK includes a first clock signal line CK1 that extends in the same direction as the gate line (the first direction) in the inside of the display region AA, and a second clock signal line CK2 that extends in the same direction as the source line (an example of the second direction) outside the display region AA. The first clock signal line CK1 and the second clock signal line are connected with each other in a frame region AA. The first clock signal line CK1 is connected to at least one of TFTs of a gate driver arranged in the inside of the display region AA.

The first and second clock signal lines CK1, CK2 can be provided for clock signals, respectively. For example, in a case where eight clock signals having different phases are used as is the case with the present embodiment, eight pairs of first and second clock signal lines CK1, CK2 are provided. The first clock signal line CK1 is provided in a pixel row corresponding to a gate driver that operates in accordance with the clock signal as a target. According to this, the configuration can be such that the clock signals intersect with none of the gate lines. This makes it possible to suppress influences of clock signals with respect to pixels of gate lines whose potentials change at the same timings as the clock signals.

Figure 21:
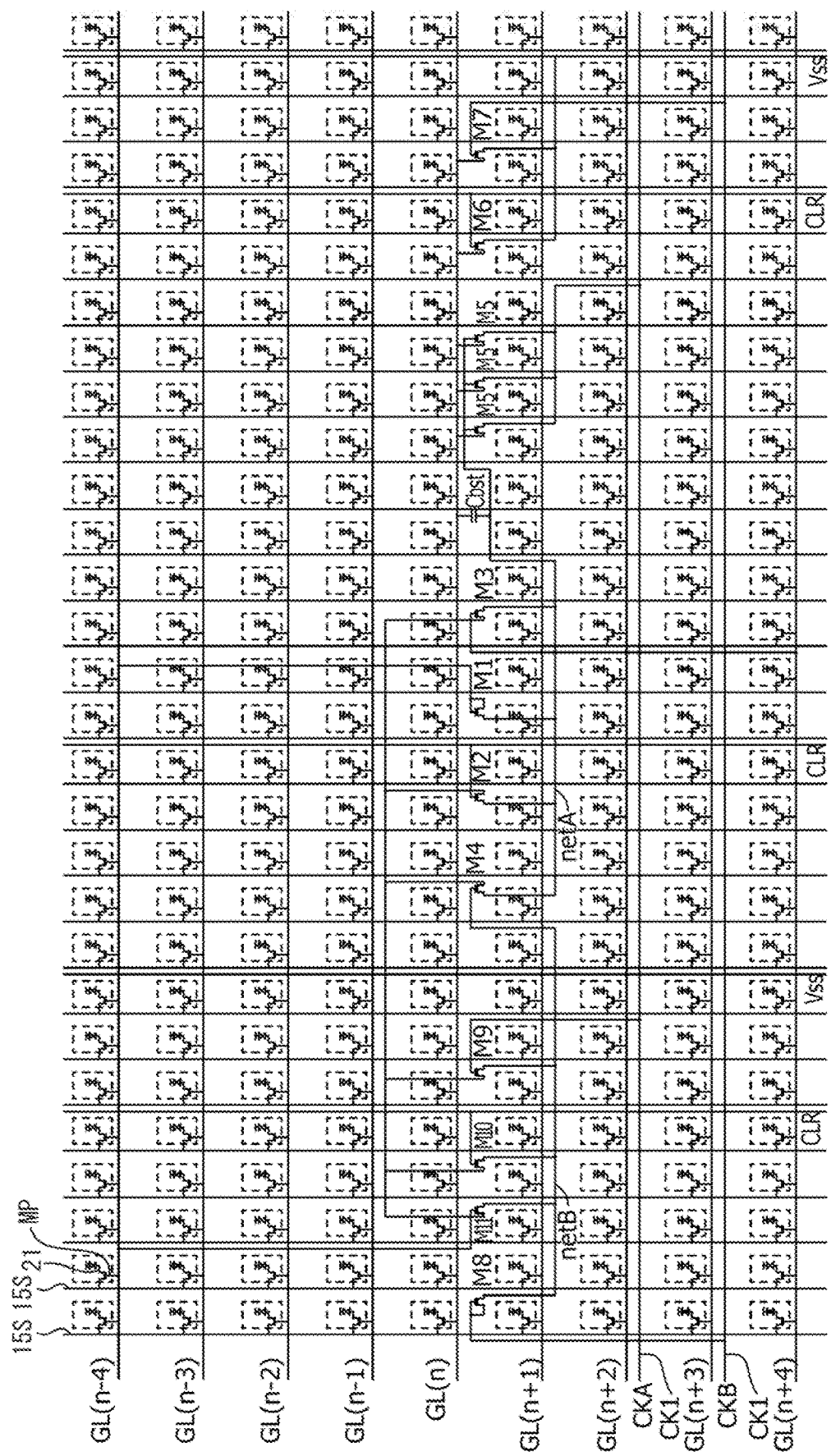
FIG. 21 is an exemplary circuit configuration in a case where the gate driver illustrated in FIG. 18 is arranged in the display region AA.

FIG. 21 is an exemplary circuit configuration in a case where the gate driver illustrated in FIG. 18 is arranged in the display region AA. In the example illustrated in FIG. 21, in correspondence to the gate line GL(n) in the n'th row, TFTs M1 to M11, the capacitor Cbst, and netA, netB of the gate driver 11(n) that drives the gate line GL(n) are provided. In this example, the gate line closest to the gate driver 11(n) is the gate line GL(n) that the gate driver 11(n) drives. The configuration, however, may be such that the gate driver 11(n) is arranged closer to another gate line, rather than the corresponding gate line GL(n), as is the case with the above-described embodiments.

In the example illustrated in FIG. 21, TFTs M1 to M11 and the capacitor Cbst of the gate driver 11(a) are arranged along the gate line GL(n). The lines netA, netB are partially arranged along, not the gate line GL(n), but another gate line GL(n+1). Further, the first clock signal line CK1 for the clock signal CKA connected to TFT M9, TFT M5 and the first clock signal line CK1 for the clock signal CKB connected to TFT M7, M8 are arranged along still other gate lines GL(n+2) and GL(n+3), respectively.

The first clock signal line can be arranged at a position closer to, not a gate line whose potential change at the same timing as that of the potential change of the clock signal is more frequent, but to a gate line GL whose potential change at the same timing is less frequent. According to this configuration, the first clock signal line can be arranged at a position closer to pixels to which the clock signal less possibly influences, rather than pixels to which the clock signal more possibly influences. For example, by using a clock of eight phases as in the present embodiment, the ratio of gate lines whose potential change at the same timing as the clock signal is less frequent increases. This increases the degree of freedom in design of the first clock signal line.

Incidentally, the present embodiment can be also applied to a gate driver that uses a multiphase clock other than eight-phase clock or single-phase clock. Further, the present embodiment can be combined with at least one of Embodiments 1 and 2 described above.

An active matrix substrate in the present embodiment includes: a plurality of gate lines that extend in a first direction in a display region; a plurality of source lines that extend in a second direction in the display region, the second direction being different from the first direction; pixel switching elements that are provided respectively for pixels in the display region and are connected to the gate lines and the source lines, the pixels being defined by the gate lines and the source lines; a plurality of gate line driving circuits that are provided in the display region, in correspondence to the gate lines, respectively, the gate line driving circuits controlling the potentials of the gate lines, respectively; and control signal lines that supply control signals from outside the display region to the gate line driving circuits.

Each of the gate line driving circuits includes a plurality of driving switching elements for switching ON/OFF according to the control signals. The control signal lines include clock signal lines. The clock signal lines include, in the display region; a first clock line that extends in the first direction and is connected to at least one of the switching elements of the gate line driving circuit in the display region; and a second clock line that is connected to the first clock line and extends in the second direction outside the display region.

With the configuration of the present embodiment, the clock signals can be formed so as not to intersect with the gate lines whose potentials change at the same timing as the clock signal. This enables to suppress the deterioration of display quality.

<Other Modification Example>

The present application invention is not limited to Embodiments 1 to 3 described above. For example, the gate drivers according to Embodiment 1 or 2 can be mounted on a rectangular-shape panel. Further, part of functions of the gate driver 11 in Embodiments described above can be realized by elements outside the display region.

In the foregoing descriptions of Embodiments 1 to 3, an exemplary case where the display panel 2 is a liquid crystal panel is described, but the present invention can be applied to a panel of such a display style that an active matrix substrate in which organic electro-luminescence (EL), MEMS shutters, or the like is used is driven.

The active matrix substrates and the display panels in the above-described embodiments and modification examples can be utilized for displays such as displays on smartphones, tablet terminals, and speedometers of vehicles, as well as displays on pachinko machines, game machines, and the like.

DESCRIPTION OF REFERENCE NUMERALS 1 liquid crystal display device
2 display panel
11 gate driver (one example of gate line driving circuit)
13G, GL gate line
15S source line
20a active matrix substrate
M1 to M11 TFT (one example of driving switching element)
MP pixel-TFT (one example of pixel switching element)
Cbst capacitor

The invention claimed is:
1. An active matrix substrate comprising:
a plurality of gate lines that extend in a first direction in a display region;
a plurality of source lines that extend in a second direction in the display region, the second direction being different from the first direction;
pixel switching elements provided for pixels, respectively, in the display region and are connected to the gate lines and the source lines, the pixels being defined by the gate lines and the source lines;
pixel electrodes provided for the pixels, respectively, and are connected to the pixel switching elements;
a plurality of gate line driving circuits that are provided in the display region, in correspondence to each of the gate lines to control a potential thereof; and
a control signal line that supplies a control signal from outside the display region to the gate line driving circuits,
wherein the pixels includes a first pixel and a second pixel adjacent to the first pixel,
each of the gate line driving circuits includes a plurality of driving switching elements for switching ON/OFF according to the control signal, and a capacitor that is connected to at least one of the driving switching elements,
at least part of the driving switching elements and the capacitor are arranged at positions closer to, not the gate line corresponding to the gate line driving circuit that includes the driving switching elements, but another gate line that is other than the corresponding gate line, the control signal line includes a clock signal line that is connected to a drain electrode of the plurality of driving switching elements and extends in the second direction, and the clock signal line is formed at a position overlapping the pixel electrode of the second pixel in plan view.

2. The active matrix substrate according to claim 1, wherein the plurality of the gate line driving circuits are positioned on one side of the pixel electrodes and a corresponding one of the gate lines that is controlled by the plurality of the gate line driving circuits is positioned on an opposite side of the pixel electrodes.

3. The active matrix substrate according to claim 1, wherein each of the gate line driving circuits includes an accumulation line for accumulating a voltage to be applied to the gate line corresponding to the gate line driving circuit, the capacitor includes a first capacitor connected to between the accumulation line and the corresponding gate line, the driving switching elements include a first switching element connected to between the accumulation line and the corresponding gate line, and at least any of the accumulation line, the first capacitor, and the first switching element is arranged at a position closer to the another gate line, than the corresponding connected gate line.

4. The active matrix substrate according to claim 1, wherein the control signal includes a clock signal, and the clock signal is a multiphase clock of four or more phases.

5. The active matrix substrate according to claim 1, wherein the control signal line includes a clock signal line, and the clock signal line includes:

a first clock line that extends in the first direction in the display region, and is connected to at least one of the switching elements of the gate line driving circuit in the display region; and a second clock line that is connected to the first clock line and extends in the second direction outside the display region.

6. A display panel comprising:

the active matrix substrate according to claim 1;

a counter substrate opposed to the active matrix substrate; and a liquid crystal layer provided between the active matrix substrate and the counter substrate.

7. An active matrix substrate comprising:

a plurality of gate lines that extend in a first direction in a display region;

a plurality of source lines that extend in a second direction in the display region, the second direction being different from the first direction;

pixel switching elements provided for pixels, respectively, in the display region and are connected to the gate lines and the source lines, the pixels being defined by the gate lines and the source lines;

a plurality of gate line driving circuits that are provided in the display region, in correspondence to each of the gate lines to control a potential thereof; and a control signal line that supplies a control signal from outside the display region to the gate line driving circuits, wherein each of the gate line driving circuits includes a plurality of driving switching elements for switching ON/OFF according to the control signal, the control signal line includes a clock signal line, and the clock signal line includes a first clock line that extends in the first direction and is connected to at least one of the plurality of driving switching elements of the gate line driving circuits in the display region and a second clock line that is connected to the first clock line and extends in the second direction out of the display region.

8. The active matrix substrate according to claim 7, wherein the control signal includes a clock signal, and the clock signal is a multiphase clock of four or more phases.

* * * * *